(12) United States Patent
Hosotani

(10) Patent No.: US 10,897,155 B2
(45) Date of Patent: Jan. 19, 2021

(54) POWER TRANSMISSION DEVICE AND WIRELESS POWER TRANSFER SYSTEM

(71) Applicant: Murata Manufacturing Co., Ltd., Kyoto-fu (JP)

(72) Inventor: Tatsuya Hosotani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 224 days.

(21) Appl. No.: 15/861,045

(22) Filed: Jan. 3, 2018

(65) Prior Publication Data
US 2018/0131236 A1  May 10, 2018

Related U.S. Application Data

(63) Continuation of application No. PCT/JP2016/069218, filed on Jun. 29, 2016.

(30) Foreign Application Priority Data

Jul. 10, 2015 (JP) .................. 2015-138925

(51) Int. Cl.
H02J 50/12 (2016.01)
H01L 29/74 (2006.01)
H02J 5/00 (2016.01)

(52) U.S. Cl.
CPC ............ *H02J 50/12* (2016.02); *H01L 29/742* (2013.01); *H02J 5/005* (2013.01)

(58) Field of Classification Search
CPC ... H02J 50/12; H02J 5/00; H02J 50/00; H01L 29/00
(Continued)

(56) References Cited

U.S. PATENT DOCUMENTS 5,973,363 A * 10/1999 Staab ................ H01L 21/76264
257/288
6,321,067 B1 * 11/2001 Suga ........................ H02J 50/90
455/41.2
(Continued)

FOREIGN PATENT DOCUMENTS

CN  104539063 A * 4/2015
CN  104539063 A   4/2015
(Continued)

OTHER PUBLICATIONS

International Search Report issued in PCT/JP2016/069218; dated Sep. 13, 2016.
(Continued)

*Primary Examiner* — Rexford N Barnie
*Assistant Examiner* — Joseph N Inge
(74) *Attorney, Agent, or Firm* — Studebaker & Brackett PC

(57) ABSTRACT

A power transmission device includes a power transmission coil, a power-transmission resonance capacitor that forms, together with the power transmission coil, a power-transmission resonance mechanism, and a power transmission circuit electrically connected to the power-transmission resonance mechanism that intermittently applies a direct-current input voltage to the power-transmission resonance mechanism and causes the power transmission coil to generate an alternating-current voltage. The power transmission circuit includes a control circuit section including an oscillator, and a power circuit section formed of an integrated circuit sealed in a small-sized package with a plurality of terminals. The integrated circuit is electrically and directly connected to the power-transmission resonance mechanism. The control circuit section oscillates at a predetermined frequency and outputs a driving signal which is input to the power circuit section. The power circuit section intermit-
(Continued)

US 10,897,155 B2

Page 2 tently applies a direct-current voltage to the power-transmission resonance mechanism using a transistor in the integrated circuit.

17 Claims, 31 Drawing Sheets

(58) Field of Classification Search
USPC .......................................................... 307/104
See application file for complete search history.

(56) References Cited

U.S. PATENT DOCUMENTS

| | | | | |
|---|---|---|---|---|
| 2008/0290736 A1* | 11/2008 | Onishi | ............... | H02J 7/025 |
| | | | | 307/107 |
| 2009/0015210 A1* | 1/2009 | Kojima | ............... | H02J 5/005 |
| | | | | 320/163 |
| 2009/0127937 A1* | 5/2009 | Widmer | ............... | H02J 50/005 |
| | | | | 307/149 |
| 2010/0007307 A1* | 1/2010 | Baarman | ............... | H02J 7/00034 |
| | | | | 320/108 |
| 2013/0300210 A1* | 11/2013 | Hosotani | ............... | H02J 5/005 |
| | | | | 307/104 |
| 2015/0214788 A1* | 7/2015 | Hosotani | ............... | H02J 50/12 |
| | | | | 307/104 |
| 2015/0333530 A1* | 11/2015 | Moyer | ............... | H02J 5/005 |
| | | | | 307/104 |
| 2016/0156231 A1* | 6/2016 | Shibuya | ............... | H02J 50/12 |
| | | | | 455/82 |
| 2017/0244282 A1* | 8/2017 | Zhang | ............... | H02J 50/70 |

FOREIGN PATENT DOCUMENTS

| | | |
|---|---|---|
| JP | H10-327544 A | 12/1998 |
| JP | 2008-141816 A | 6/2008 |
| JP | 2010-200563 A | 9/2010 |
| JP | 2012-075304 A | 4/2012 |
| JP | 5321758 B2 | 10/2013 |
| WO | 2014/057959 A1 | 4/2014 |

OTHER PUBLICATIONS

Written Opinion issued in PCT/JP2016/069218; dated Sep. 13, 2016.
Namiki; 6.6.1 Pull Up and Pull-Up Resistor; Partial Translation of "Digital Circuit & Verilog HDL"; 1st edition; Gijutsu Hyohron Co., Ltd.; Feb. 25, 2008; pp. 241 to 242.
An Office Action mailed by the China National Intellectual Property Administration on May 6, 2020, which corresponds to Chinese Patent Application No. 201680040612.0 and is related to U.S. Appl. No. 15/861,045 with English language translation.

* cited by examiner

US 10,897,155 B2

POWER TRANSMISSION DEVICE AND WIRELESS POWER TRANSFER SYSTEM

CROSS-REFERENCE TO RELATED APPLICATION

This application claims benefit of priority to International Patent Application No. PCT/JP2016/069218, filed Jun. 29, 2016, and to Japanese Patent Application No. 2015-138925, filed Jul. 10, 2015, the entire contents of each are incorporated herein by reference.

BACKGROUND

Technical Field

The present disclosure relates to a wireless power transfer apparatus that includes a power transmission device, which includes a power transmission coil, and a power reception device, which includes a power reception coil, and in which power is wirelessly transferred from the power transmission device to the power reception device.

Background Art

In recent years, research and development for reducing power loss in the entire system has been actively conducted with the aim of putting wireless power transfer into practical use. In particular, in a system in which an electromagnetic resonance field is formed and in which wireless power transfer is performed by using electromagnetic-field resonance coupling, power loss can be reduced by simplifying the process of transferring power as described, for example, in Japanese Patent No. 5321758.

SUMMARY

FIG. 30 illustrates a configuration example of a wireless power transfer apparatus of the related art. The wireless power transfer apparatus includes a power transmission device Txp and a power reception device Rxp. The power transmission device Txp includes a power transmission coil L12, a power-transmission resonance capacitor Cr that forms, together with with the power transmission coil L12, a power-transmission resonance mechanism, and a power transmission circuit 11 that is electrically connected to the power-transmission resonance mechanism 12 and that intermittently applies a direct-current (DC) input voltage to the power-transmission resonance mechanism 12 and causes the power transmission coil L12 to generate an alternating-current (AC) voltage. The power reception device Rxp includes a power reception coil L21, a power-reception resonance capacitor Crs that forms a power-reception resonance mechanism 21 with the power reception coil L21, and a power reception circuit 22 that is electrically connected to the power-reception resonance mechanism 21 and that supplies power to a load.

In the above-described wireless power transfer apparatus, as illustrated in FIG. 30, the power transmission circuit 11 of the related art includes a power block 103 that includes two power semiconductor devices Q1 and Q2, a driving block 102 that drives the power semiconductor devices Q1 and Q2, and a control block 101 that supplies a control signal to the driving block 102. The control block 101 includes an oscillation circuit 1 that generates a signal at a predetermined frequency and a control circuit 2 that supplies a control signal to the driving block 102.

The inventor of the present application discovered the following problems concerning such a wireless power transfer apparatus of the related art.

(1) The power transmission circuit 11 has a large-scale circuit configuration, and it is difficult to reduce the size of the power transmission device.

(2) In general, the control block 101, the driving block 102, and the power block 103 are supplied with different power supply voltages, and thus, it is necessary to generate and prepare a plurality of power supply voltages. Consequently, the size of the power transmission device increases.

(3) Wiring according to the arrangement of the power block 103 is required, and radiation of electromagnetic noise is large due to the wiring and the like.

(4) Electromagnetic noise characteristics vary in accordance with the arrangement of the power block 103. Thus, it is necessary to take measures against the electromagnetic noise for each design of the power transmission circuit 11, and the design is complicated.

(5) Since the power block 103 is formed by using the individual power semiconductor devices Q1 and Q2, the power block 103 has a large footprint, and it is difficult to reduce the size of the power transmission circuit 11.

(6) In each of the individual power semiconductor devices Q1 and Q2, a heat sink is generally sealed in a package. Thus, the footprints of the power semiconductor devices Q1 and Q2 are large, and it is difficult to reduce the size of the power transmission circuit 11. In addition, when the power semiconductor devices Q1 and Q2 are arranged independently of each other, the thermal resistance between the power semiconductor devices Q1 and Q2 is large. Thus, in the case of trying to level out and dissipate the heat generated by the power semiconductor devices Q1 and Q2, the structure for levelling out and dissipating the heat becomes complex, and this makes it difficult to reduce the size of the power transmission circuit 11.

Accordingly, it is an object of the present disclosure to provide a power transmission device capable of being easily reduced in size and having favorable electromagnetic noise characteristics and a wireless power transfer system that includes the power transmission device.

(1) A power transmission device according to the present disclosure included in a wireless power transfer system that includes the power transmission device and a power reception device and in which power is supplied from the power transmission device to the power reception device includes a power transmission coil, a power-transmission resonance capacitor that forms, together with the power transmission coil, a power-transmission resonance mechanism, and a power transmission circuit that is electrically connected to the power-transmission resonance mechanism and that intermittently applies a direct-current input voltage to the power-transmission resonance mechanism and causes the power transmission coil to generate an alternating-current voltage. The power reception device includes a power reception coil, a power-reception resonance capacitor that forms a power-reception resonance mechanism with the power reception coil, and a power reception circuit that is electrically connected to the power-reception resonance mechanism and that supplies power to a load. The power transmission circuit includes a control circuit section and a power circuit section each of which is formed of an electronic circuit. The power circuit section is formed of an integrated circuit sealed in a package with a plurality of terminals. The integrated circuit is electrically and directly connected to the power-transmission resonance mechanism. The control circuit section outputs a driving signal to the power circuit section. The power circuit section drives, by using the driving signal input to the power circuit section, a transistor provided in the integrated circuit and intermittently applies the direct-current input voltage to the power-transmission resonance mechanism.

With the above-described configuration, the following can be attained:

(a) As a result of the power circuit section of the power transmission circuit being formed of the integrated circuit, a reduction in the size and weight of the power transmission device can be achieved. Consequently, a simple wireless power transfer system can be constructed.

(b) By integrating the power circuit section, the mounting density can be increased, and generation of electromagnetic noise can be suppressed also in a high-frequency, high-speed operation.

(c) By sealing the electronic circuit of the power circuit section into a small-sized package, a heat-dissipation structure is simplified.

(d) By sealing a plurality of power semiconductor devices in a small-sized package, it is not necessary to individually seal a heat sink of each of the power semiconductor devices into a package, and the heat-dissipation structure is simplified, so that the size of the power transmission circuit can be reduced.

The above-described advantageous effects can thus be obtained.

(2) In the above configuration (1), it is preferable that at least a portion of the control circuit section and at least a portion of the power circuit section be formed of a complementary metal oxide semiconductor (CMOS) standard logic integrated circuit (IC) or a transistor-transistor logic (TTL) standard logic IC that includes a plurality of logic gate circuits and that is sealed in a single small-sized package with a plurality of terminals. As a result, an overwhelmingly inexpensive power transmission device can be fabricated by forming the power transmission device by using a standard logic IC, which is widely distributed in the market. In addition, unprecedentedly and overwhelmingly small-sized, simple wireless power transfer can be realized.

(3) In the above configuration (2), it is preferable that the CMOS standard logic IC or the TTL standard logic IC include four two-input NAND gates. As a result, the power transmission device can be formed by using a single standard logic IC. In addition, an overwhelmingly inexpensive and simple power transmission device can be formed.

(4) In the above configuration (3), it is preferable that the control circuit section include an oscillation circuit that includes one of the four NAND gates and an oscillator and that the power circuit section include the remaining NAND gates among the four NAND gates. As a result, both the control circuit section and the power circuit section can be formed by using a standard logic IC, and a circuit within the standard logic IC can be effectively used.

(5) In the above configuration (4), it is preferable that, in the control circuit section, one of the remaining NAND gates (that is not connected in parallel) be connected to an output unit of the oscillation circuit. As a result, a waveform is shaped by the one NAND gate (driving circuit unit), and a switching operation is performed by the power circuit section at an appropriate timing, so that larger electric power can be handled. In addition, concentration of power loss that is generated as a result of the switching operation being performed by the power circuit section at an inappropriate timing can be suppressed.

(6) In the above configurations (4) or (5), it is preferable that some of the remaining NAND gates be connected in parallel. As a result, the current-carrying capacity of the power circuit section is increased, and larger electric power can be handled.

(7) In the above configuration (2), it is preferable that the CMOS standard logic IC or the TTL standard logic IC include six NOT gates. As a result, the power transmission device can be formed by using a single standard logic IC. In addition, an overwhelmingly inexpensive and simple power transmission device can be formed.

(8) In the above configuration (7), it is preferable that the control circuit section include an oscillation circuit that includes one of the six NOT gates and an oscillator and that the power circuit section include the remaining NOT gates among the six NOT gates. As a result, both the control circuit section and the power circuit section can be formed by using a standard logic IC, and a circuit within the standard logic IC can be effectively used.

(9) In the above configuration (8), it is preferable that, in the control circuit section, one of the remaining NOT gates (that is not connected in parallel) be connected to an output unit of the oscillation circuit. As a result, a waveform is shaped by the one NAND gate (driving circuit unit), and a switching operation is performed by the power circuit section at an appropriate timing, so that larger electric power can be handled. In addition, concentration of power loss that is generated as a result of the switching operation being performed by the power circuit section at an inappropriate timing can be suppressed.

(10) In the above configurations (8) or (9), it is preferable that some of the remaining NOT gates be connected in parallel. As a result, the current-carrying capacity of the power circuit section is increased, and larger electric power can be handled.

(11) In the above configuration (1), it is preferable that the power circuit section be formed of a field effect transistor (FET) driving driver IC sealed in a package. As described above, by using the FET driving driver IC as the power circuit section, the power transmission device can be formed with a simple circuit. In addition, electric power larger than that in the case of using a standard logic IC can be transferred.

(12) In any one of the above configurations (2) to (11), it is preferable that an output unit (output stage) of the power circuit section be formed of two transistors that are bridge-connected between a power supply and a ground. As a result, the symmetry of a source current and a sink current with respect to the power-transmission resonance mechanism is enhanced, and a resonance current flows with higher efficiency.

(13) In any one of the above configurations (1) to (12), it is preferable that the oscillator be a device in which a piezoelectric vibrator (including a crystal unit) is sealed in a package. As a result, a reduction in the size and weight of the control circuit section can be achieved.

(14) In any one of the above configurations (4) to (6), it is preferable that or any one of the above (8) to (10), it is preferable that an oscillation frequency of the oscillation circuit be one of 6.78 MHz, 13.56 MHz, and 27.12 MHz, which are frequencies within the industrial, scientific, and medical (ISM) band. As a result, electromagnetic interference with radio communication can be avoided, and electromagnetic compatibility can be improved. In addition, as a switching frequency becomes higher, power loss such as switching loss is likely to increase, and thus, by using 6.78 MHz, 13.56 MHz, or 27.12 MHz, which are low frequencies within the ISM band, both a reduction in the power loss and an improvement in the electromagnetic compatibility in the wireless power transfer apparatus can be achieved.

(15) In any one of the above configurations (1) to (14), it is preferable that a filter circuit that enables a current at the switching frequency to flow through the filter circuit and suppresses a harmonic current be provided at a final stage of the power circuit section. As a result, a harmonic component is suppressed, and generation of electromagnetic noise can be suppressed also in a high-frequency, high-speed operation.

(16) In any one of the above configurations (1) to (15), it is preferable that, in the switching operation performed by the power circuit section, a dead time in which transistors that operate complementarily to each other are both turned off be provided and that a lagging current, which lags a voltage, be generated. As a result, by commutating the current during the dead time and performing a zero-voltage-switching operation, power loss in the transistors can be reduced.

(17) In any one of the above configurations (1) to (16), it is preferable that the power circuit section and the control circuit section operate as a result of the same power supply voltage being applied to the power circuit section and the control circuit section. As a result, by using a single voltage supply for a power supply voltage that causes the power transmission circuit to operate, it is not necessary to provide a plurality of voltage supplies, and a small, lightweight power transmission device can be fabricated.

(18) A wireless power transfer system according to the present disclosure includes the power transmission device described in any one of the above configurations (1) to (17) and a power reception device. Electric field energy and magnetic field energy of each of the power-transmission resonance mechanism and the power-reception resonance mechanism interact with each other so as to form an electromagnetic resonance field. Electromagnetic field resonance coupling is formed of magnetic field coupling and electric field coupling between the power transmission coil and the power reception coil. Power is supplied from the power transmission device to the power reception device that are spaced apart from each other.

With the above-described configurations, a simple wireless power transfer system that includes a power transmission device of reduced size can be constructed. In addition, a wireless power transfer system that includes power transmission device having favorable electromagnetic noise characteristics can be constructed.

(19) In the above configuration (18), it is preferable that the wireless power transfer system further include at least one relay device that includes a relay resonance mechanism including a relay coil and a relay resonance capacitor. It is preferable that electric field energy and magnetic field energy of each of the power-transmission resonance mechanism, the power-reception resonance mechanism, and the relay resonance mechanism interact with each other so as to form an electromagnetic resonance field and that electromagnetic field resonance coupling be formed of magnetic field coupling and electric field coupling between the power transmission coil, the power reception coil, and the relay coil.

With the above-described configurations, the electromagnetic resonance field is expanded by the relay device, and a spatial region in which wireless power transfer is desired to be realized can be expanded.

(20) In the above configuration (19), the at least one relay device may include a plurality of relay devices. As a result, the electromagnetic resonance field can be arbitrarily expanded, and a spatial region in which wireless power transfer is desired to be realized can be arbitrarily designed.

(21) In the above configurations (19) and (20), it is preferable that at least two of independent resonant frequencies each of which is solely used by one of the power-transmission resonance mechanism, the power-reception resonance mechanism, and the relay resonance mechanism be the same as each other. By causing the independent resonant frequencies to be the same as each other in this manner, in a situation where resonance characteristics become unimodal, changes in a resonance frequency can be suppressed with respect to changes in coupling coefficient due to changes in a distance or the like, and stable wireless power transfer can be performed.

According to the present disclosure, a power transmission device capable of being easily reduced in size and having favorable electromagnetic noise characteristics and a wireless power transfer system that includes the power transmission device can be obtained.

DESCRIPTION OF EMBODIMENTS

Figure 1:
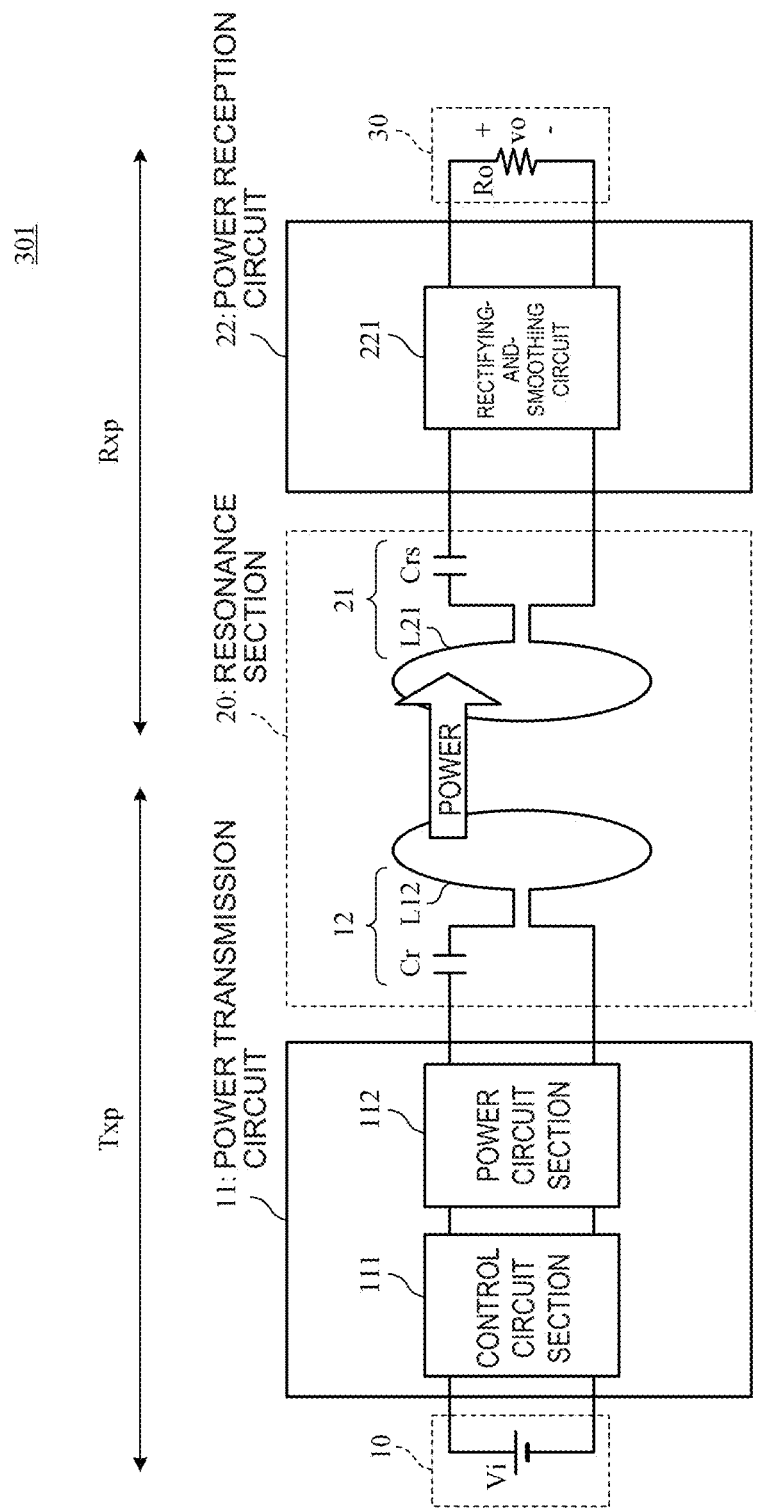
FIG. 1 is a block diagram of a wireless power transfer system 301 according to a first embodiment of the present disclosure.

A plurality of embodiments of the present disclosure will be described below using some specific examples with reference to the drawings. The same members in the drawings are denoted by the same reference numerals. Although the embodiments will be separately described for convenience of description and for ease of understanding and explaining the gist of the present disclosure, the configurations according to the different embodiments can be partially replaced with one another or can be combined with each other. In the second embodiment and the subsequent embodiments, description of elements common to the first embodiment will be omitted, and only differences from the first embodiment will be described. In particular, similar advantageous effects obtained in similar configurations will not be described in every embodiment.

First Embodiment

FIG. 1 is a block diagram of a wireless power transfer system 301 according to a first embodiment. The wireless power transfer system includes a power transmission device Txp and a power reception device Rxp. The power transmission device Txp includes a power transmission coil L12, a power-transmission resonance capacitor Cr that forms, together with the power transmission coil L12, a power-transmission resonance mechanism 12, and a power transmission circuit 11 that is electrically connected to the power-transmission resonance mechanism 12 and that intermittently applies a DC input voltage to the power-transmission resonance mechanism 12 and causes the power transmission coil L12 to generate an AC voltage. The power reception device Rxp includes a power reception coil L21, a power-reception resonance capacitor Crs that forms a power-reception resonance mechanism 21 with the power reception coil L21, and a power reception circuit 22 that is electrically connected to the power-reception resonance mechanism 21 and that supplies power to a load.

Electric field energy and magnetic field energy of each of the power-transmission resonance mechanism 12 and the power-reception resonance mechanism 21 interact with each other so as to form an electromagnetic resonance field. The electromagnetic resonance field is illustrated as a resonance section 20 in FIG. 1.

An input power supply 10 is connected to the power transmission device Txp, and a load 30 is connected to the power reception device Rxp. Power is transferred from the power transmission device Txp to the power reception device Rxp.

The power transmission circuit 11 includes a control circuit section 111 that converts an input power supply voltage into an AC voltage and a power circuit section 112 that converts the AC voltage into electric power. The power reception circuit 22 includes a rectifying-and-smoothing circuit 221.

Figure 2:
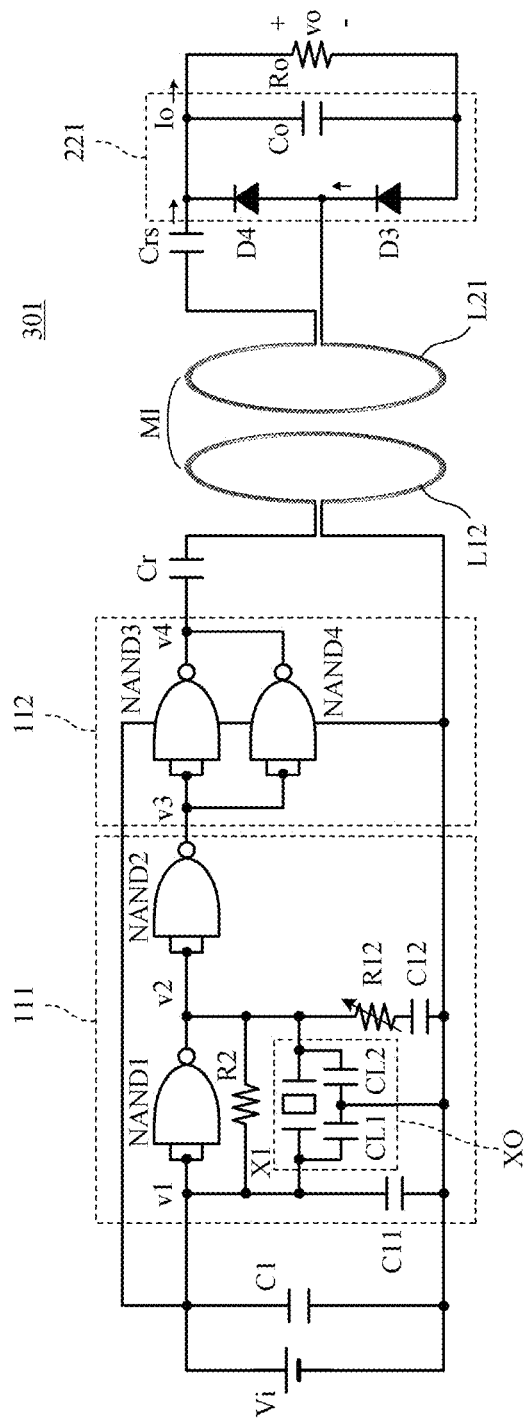
FIG. 2 is a circuit diagram of the wireless power transfer system 301 according to the first embodiment.
Figure 3:
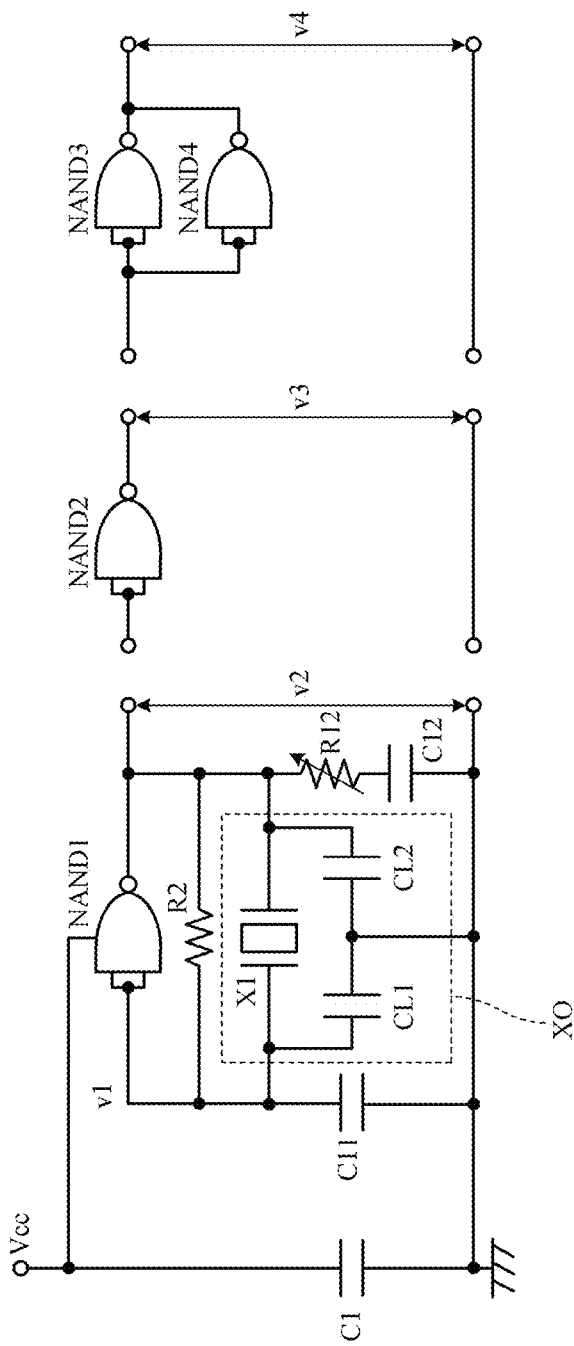
FIG. 3 is an exploded view illustrating a configuration of a power transmission circuit illustrated in FIG. 2.

FIG. 2 is a circuit diagram of the wireless power transfer system 301 according to the present embodiment. FIG. 3 is an exploded view illustrating the configuration of the power transmission circuit illustrated in FIG. 2.

The power circuit section 112 is formed of a portion of an integrated circuit that is sealed in a small-sized package with a plurality of terminals, and the integrated circuit is electrically and directly connected to the power-transmission resonance mechanism, which is formed of the power transmission coil L12 and the power-transmission resonance capacitor Cr. The control circuit section 111 includes an oscillator (crystal unit) X1. The control circuit section 111 oscillates at a predetermined frequency and outputs a driving signal to the power circuit section 112.

A driving signal is input to the power circuit section 112, and the power circuit section 112 intermittently applies a DC voltage to the above-mentioned power-transmission resonance mechanism by using a transistor included in the integrated circuit.

The control circuit section 111 and the power circuit section 112 are formed of a complementary metal oxide semiconductor (CMOS) standard logic integrated circuit (IC) or a transistor-transistor logic (TTL) standard logic IC that includes a plurality of gate circuits and that is sealed in a single small-sized package with a plurality of terminals. The present embodiment employs a standard logic IC that has four two-input NAND gates in a single package.

The control circuit section 111 includes an oscillation circuit that includes a NAND gate (NAND1), which is one of the four NAND gates, and an oscillator XO and a driving circuit that includes a NAND gate (NAND2), which is another one of the four NAND gates. An output signal from the oscillation circuit is input to the NAND gate (NAND2), and the NAND gate (NAND2) outputs a driving signal to the power circuit section 112.

The power circuit section 112 includes the remaining NAND gates (NAND3, NAND4) among the four NAND gates. The two NAND gates (NAND3, NAND4) are connected in parallel. In other words, an input terminal, an output terminal, a power supply terminal, and a ground terminal of the NAND gate (NAND3) are respectively connected in parallel to an input terminal, an output terminal, a power supply terminal, and a ground terminal of the NAND gate (NAND4).

Figure 4A:
FIG. 4A illustrates a circuit symbol of a NAND gate.
Figure 4B:
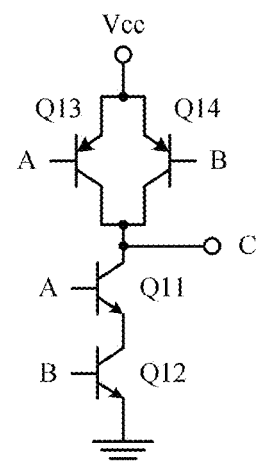
FIG. 4B is a diagram illustrating a TTL circuit.
Figure 4C:
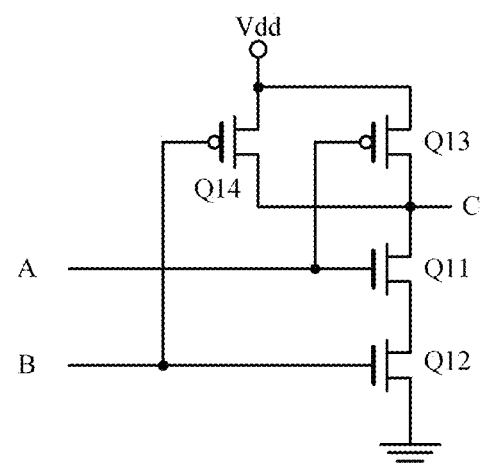
FIG. 4C is a diagram illustrating a CMOS circuit.

FIG. 4A illustrates a circuit symbol of each of the above-mentioned NAND gates. FIG. 4B is a diagram illustrating a TTL circuit, and FIG. 4C is a diagram illustrating a CMOS circuit. According to the present embodiment, each of the NAND gates is a logic gate circuit that outputs the NAND C of an input A and an input B by using transistors Q11, Q12, Q13, and Q14.

In the TTL circuit illustrated in FIG. 4B that includes a bipolar transistor, a current continuously flows through the circuit. In contrast, in the CMOS circuit, only a current for saturating gates of metal-oxide-semiconductor field-effect transistors (MOSFETs) (or for extracting electric charges from the saturated gates) flows through the circuit when the logic is inverted, and thus, a logic circuit with low power consumption can be fabricated. The CMOS circuit has a structure in which p-channel MOS-FETs Q13 and Q14 and n-channel MOS-FETs Q11 and Q12 are complementarily connected to one another. In this circuit, a power supply voltage Vdd is a voltage of about 3 V to about 15 V with respect to a ground potential.

In FIG. 2 and FIG. 3, the oscillator XO is a single component that includes the oscillator (crystal unit) X1 and capacitors CL1 and CL2. The NAND gate NAND1 and a feedback resistor R2 form an inverting amplifier circuit, and the inverting amplifier circuit, the oscillator X1, the capacitors CL1 and CL2, capacitors C11 and C12, and a resistor R12 form a Colpitts oscillation circuit. The oscillation frequency of this oscillation circuit is set by the inductive reactance between the resonant frequency and the anti-resonant frequency of the oscillator X1 and the capacitances of the capacitors CL1, CL2, C11, and C12. The resonant frequency of the oscillator X1 and the oscillation frequency are substantially equal to each other.

The oscillation frequency of the oscillation circuit according to the present embodiment is one of 6.78 MHz, 13.56 MHz, and 27.12 MHz, which are frequencies within the ISM band. The ISM band refers to the industrial, scientific, and medical (ISM) band and is a frequency band allocated by the International Telecommunication Union (ITU) for using radio waves as radio frequency energy exclusively for industrial, scientific and medical purposes other than radio communication. Radio-communication services that operate within the ISM frequency band need to accept harmful interference that may be caused by these (industrial, scientific and medical) applications, and thus, the original purpose of the ISM band is using radio waves for purposes excluding radio communication.

In a wireless power transfer system that supplies power, electromagnetic interference with radio communication can be avoided by using the ISM band for a switching frequency, which is an operating frequency, and electromagnetic compatibility can be improved. In addition, as the switching frequency becomes higher, power loss such as switching loss is likely to increase, and thus, by using 6.78 MHz, 13.56 MHz, or 27.12 MHz, which are low frequencies within the ISM band, both a reduction in the power loss and an improvement in the electromagnetic compatibility in the wireless power transfer apparatus can be achieved.

In FIG. 3, the waveform of a voltage v1 is a sinusoidal waveform having an amplitude Vcc. The waveform of a voltage v2 is a square wave (or a trapezoidal wave) having the same frequency and the same amplitude. The NAND gate NAND2 shapes the waveform of the voltage v2 and outputs a square wave (or a trapezoidal wave) having the amplitude Vcc. The NAND gates NAND3 and NAND4 output a voltage v4 as a result of a square wave (or a trapezoidal wave) voltage v3 being input thereto. As a result, the voltage v4 is intermittently applied to the power-transmission resonance mechanism.

The resonant frequency of the power-transmission resonance mechanism 12 (see FIG. 1), which is formed of the power transmission coil L12 and the power-transmission resonance capacitor Cr, and the resonant frequency of the power-reception resonance mechanism 21, which is formed of the power reception coil L21 and the power-reception resonance capacitor Crs, are each substantially equal to the above-mentioned oscillation frequency. As described above, as a result of the DC input voltage being intermittently applied to the power-transmission resonance mechanism, electromagnetic resonance occurs between the power transmission coil L12 and the power reception coil L21.

Figure 5:
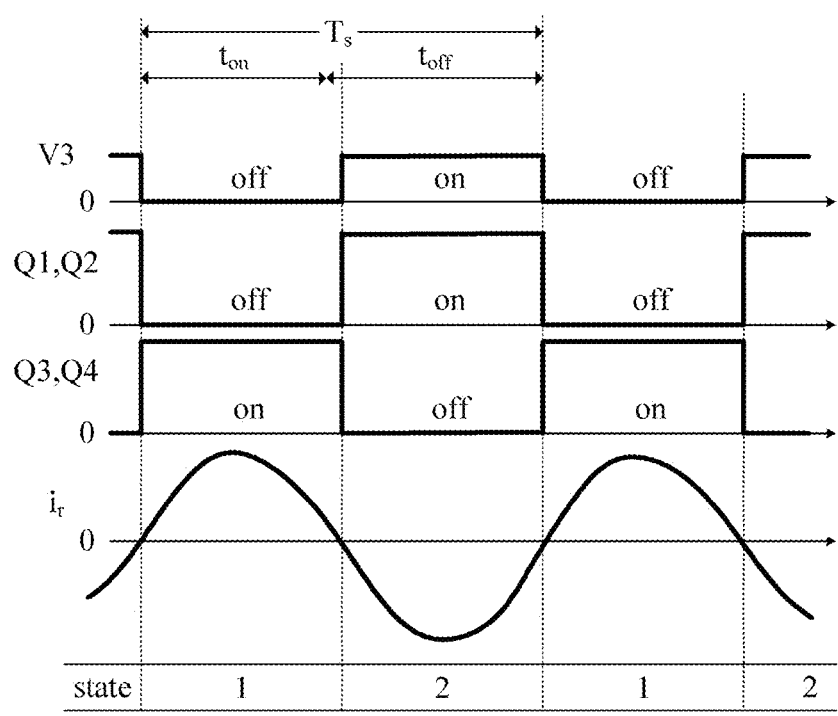
FIG. 5 is a diagram illustrating the state of each component of a power circuit section 112, a voltage waveform, and a waveform of a current that flows through a power transmission coil.

Operation of the power circuit section 112 will now be described. FIG. 5 is a diagram illustrating the state of each component of the power circuit section 112, a voltage waveform, and a waveform of a current that flows through the power transmission coil. When an input voltage V3 of the power circuit section 112 is at a low level, the transistors Q11 and Q12, which are illustrated in FIG. 4B and FIG. 4C, are each brought into an OFF state, and the transistors Q13 and Q14, which are also illustrated in FIG. 4B and FIG. 4C, are each brought into an ON state. When the input voltage V3 of the power circuit section 112 is at a high level, the transistors Q11 and Q12 are each brought into the ON state, and the transistors Q13 and Q14 are each brought into the OFF state.

An energy conversion operation in each state is as follows.

(1) State 1

In each of the NAND gates NAND3 and NAND4 of the power circuit section 112, when the transistors Q11 and Q12 are in the OFF state, and the transistors Q13 and Q14 are in the ON state, a resonance current ir flows through the power transmission coil L12, and the power-transmission resonance capacitor Cr is charged.

On a power receiving side, a diode D3 or a diode D4 is turned on, and a resonance current irs flows through the power reception coil L21. When the diode D3 is turned on, the power-reception resonance capacitor Crs is discharged. The voltage induced in the power reception coil L21 and the voltage across the power-reception resonance capacitor Crs are added together, and power is supplied to a load Ro. When the diode D4 is turned on, the power-reception resonance capacitor Crs is charged. The voltage of a capacitor Co is applied to the load Ro, and power is supplied to the load Ro.

(2) State 2

When the transistors Q11 and Q12 are in the ON state, and the transistors Q13 and Q14 are in the OFF state, the resonance current ir flows through the power transmission coil L12, and the power-transmission resonance capacitor Cr is discharged.

On the power receiving side, the diode D3 or the diode D4 is turned on, and the resonance current irs flows through the power reception coil L21. When the diode D3 is turned on, the power-reception resonance capacitor Crs is discharged. The voltage induced in the power reception coil L21 and the voltage across the power-reception resonance capacitor Crs are added together, and power is supplied to the load Ro. When the diode D4 is turned on, the power-reception resonance capacitor Crs is charged. The voltage of the capacitor Co is applied to the load Ro, and power is supplied to the load Ro.

Subsequently, State 1 and State 2 are periodically repeated. In a periodic steady operation, each of the waveforms of the currents it and irs are substantially sinusoidal due to a resonance phenomenon.

According to the present embodiment, the following advantageous effects are obtained.

(a) As a result of a principal portion of the power transmission circuit 11 being formed of an integrated circuit, a reduction in the size and weight of the power transmission device and a reduction in the size and weight of the wireless power transfer system can be achieved.

(b) A simple wireless power transfer system can be realized by the simple configuration of the power transmission device.

(c) By integrating the power circuit section 112, the mounting density can be increased, and generation of electromagnetic noise can be suppressed also in a high-frequency, high-speed operation.

(d) By sealing an electronic circuit of the power circuit section 112 into a small-sized package, a heat-dissipation structure can be simplified.

Second Embodiment

In a second embodiment, a power transmission circuit formed on a very small single circuit board will be described.

Figure 6A:
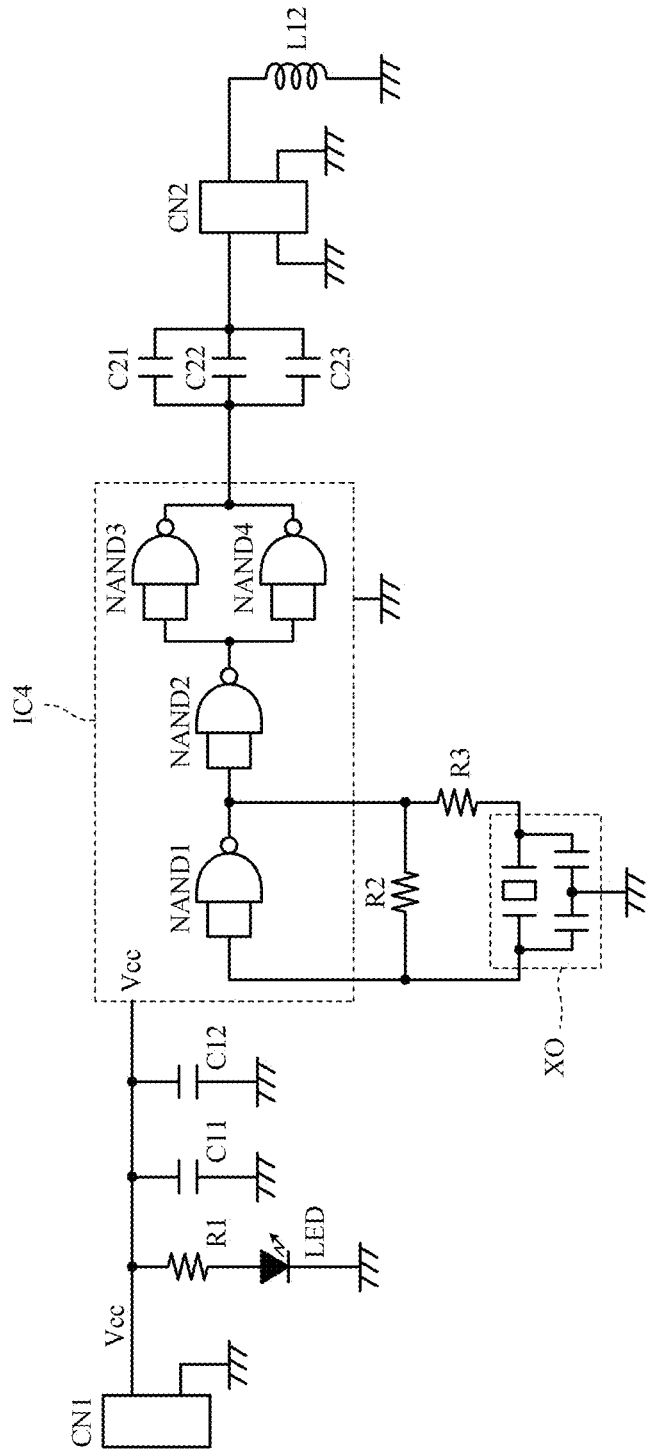
FIG. 6A is a circuit diagram of a power transmission device according to a second embodiment.
Figure 6B:
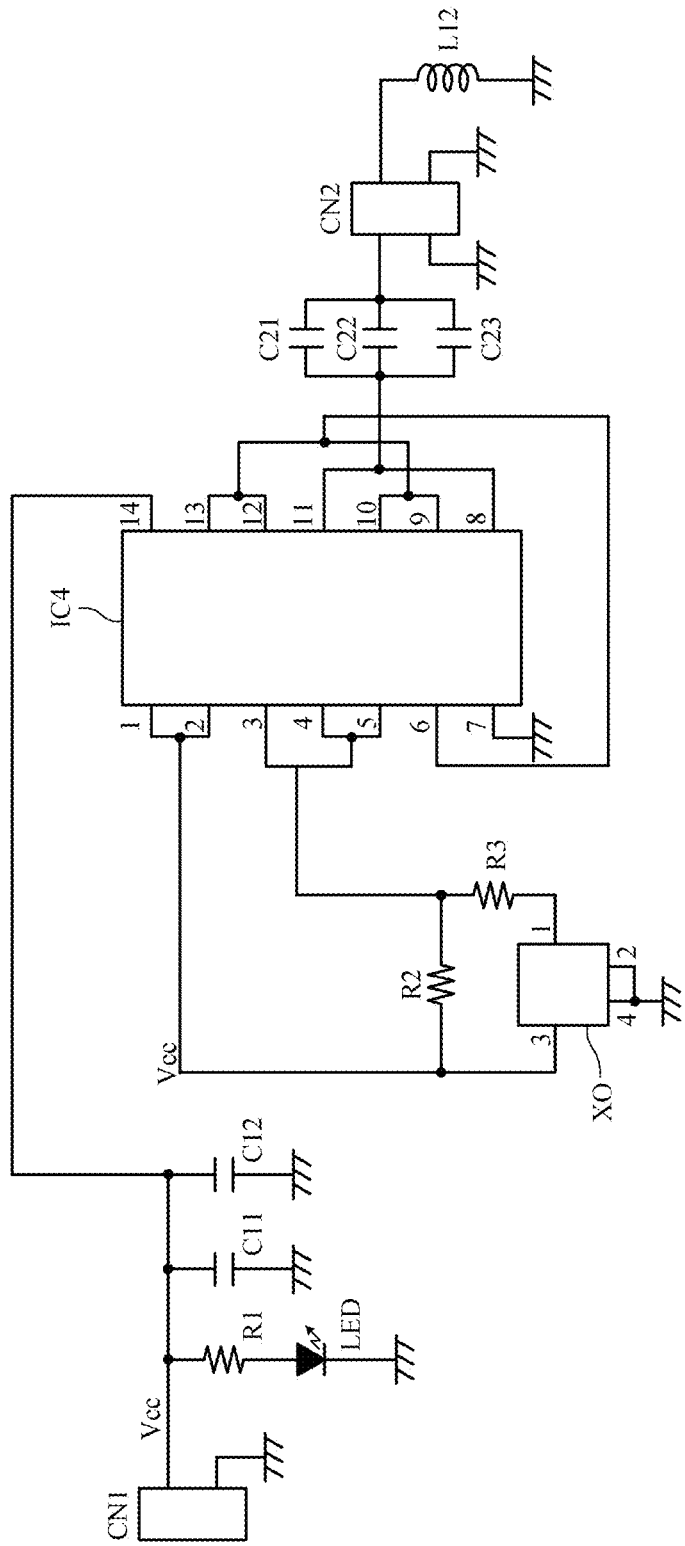
FIG. 6B is a diagram illustrating a connection relationship between components including an IC in the circuit illustrated in FIG. 6A.
Figure 7:
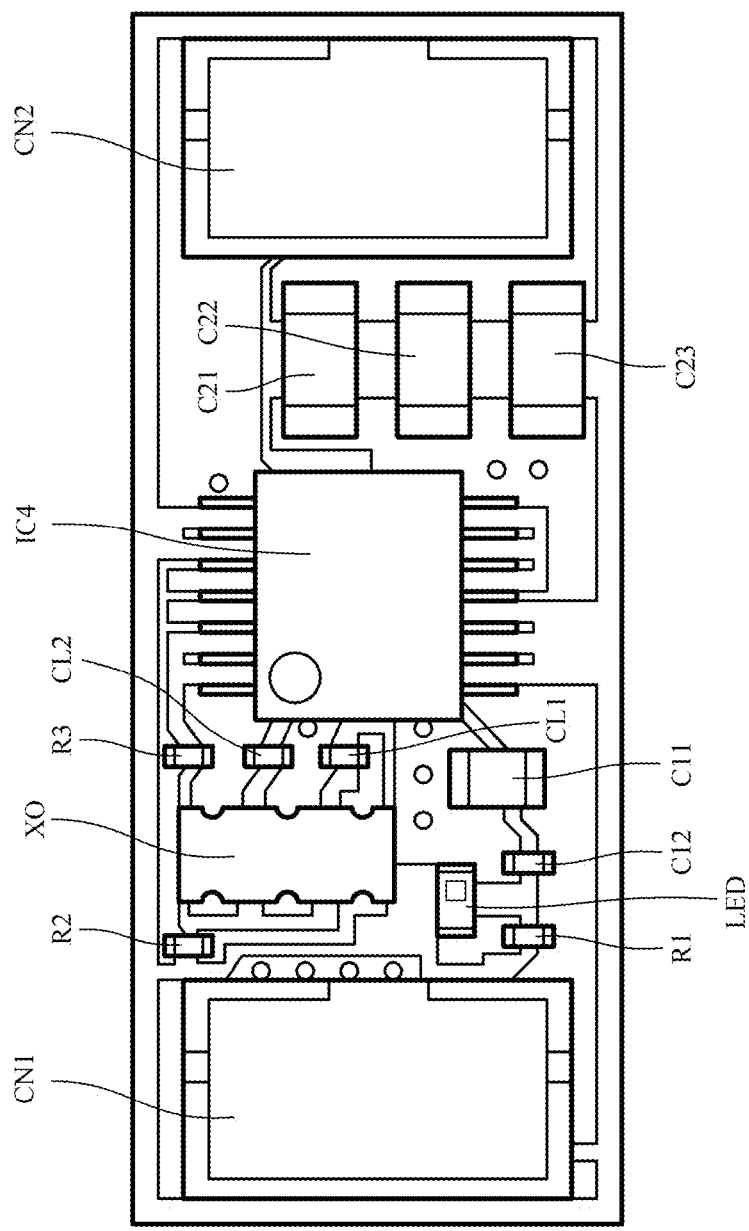
FIG. 7 is a plan view of a circuit board on which a power transmission circuit according to the second embodiment has been formed.

FIG. 6A is a circuit diagram of a power transmission device according to the second embodiment, and FIG. 6B is a diagram illustrating the connection relationship between components including an IC in the circuit illustrated in FIG. 6A. FIG. 7 is a plan view of a circuit board on which the power transmission circuit has been formed. An input power supply of, for example, 5 V is connected to a connector CN1. The power transmission coil L12 is connected to a connector CN2. A circuit that includes a light emitting diode (LED) and a resistor R1, the LED indicating application of a voltage by the input power supply, is connected between a power line and a ground. A smoothing capacitor C11 and a high-frequency filter capacitor C12 are also connected between the power line and the ground. In addition, a standard logic IC (IC4) is connected between the power line and the ground. The IC4 has four NAND gates (NAND1, NAND2, NAND3, NAND4). The resistor R2, a resistor R3, and the oscillator XO are connected between the input and the output of the NAND gate NAND1. In FIG. 6B, the numbers illustrated around the IC4 are terminal numbers of the standard logic IC having the four NAND gates therein. A parallel circuit that includes capacitors C21, C22, and C23 is connected in series between the outputs of the NAND gates NAND3 and NAND4 and the connector CN2. The parallel circuit including the capacitors C21, C22, and C23 acts as a power-transmission resonance capacitor.

In FIG. 7, the reference signs of the components on the board correspond to those of the components illustrated in FIG. 6B. As illustrated in FIG. 7, according to the present embodiment, a power transmission circuit can be formed on a very small single circuit board with a small number of necessary components.

Third Embodiment

In a third embodiment, a case will be described in which a power circuit section has a configuration different from that according to the second embodiment.

Figure 8A:
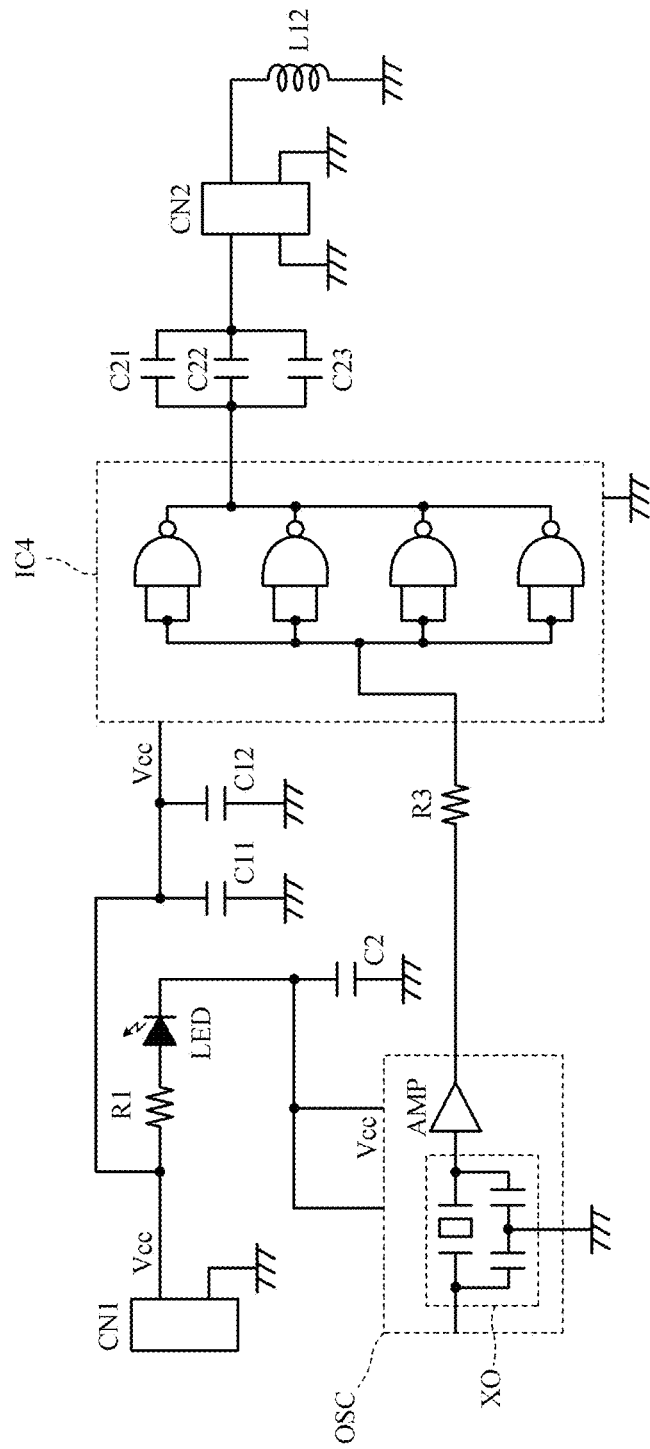
FIG. 8A is a circuit diagram of a power transmission device according to a third embodiment.
Figure 8B:
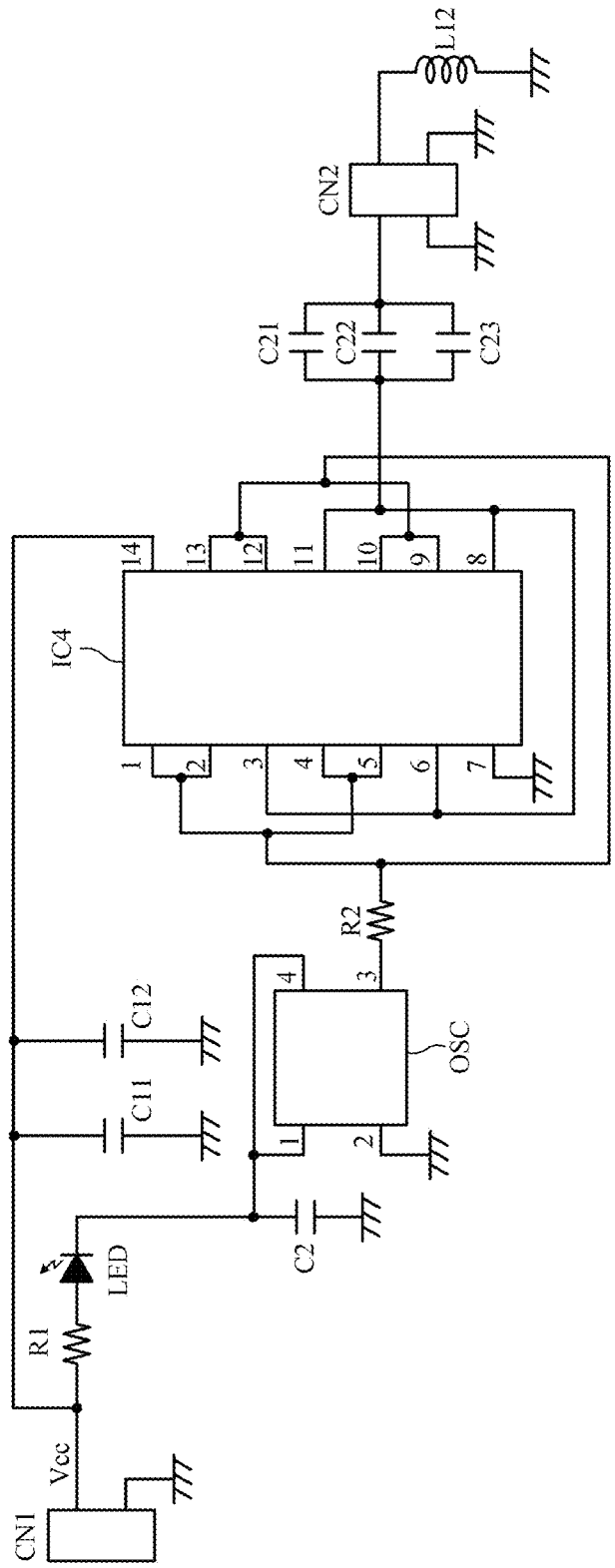
FIG. 8B is a diagram illustrating a connection relationship between components including an IC in the circuit illustrated in FIG. 8A.
Figure 9:
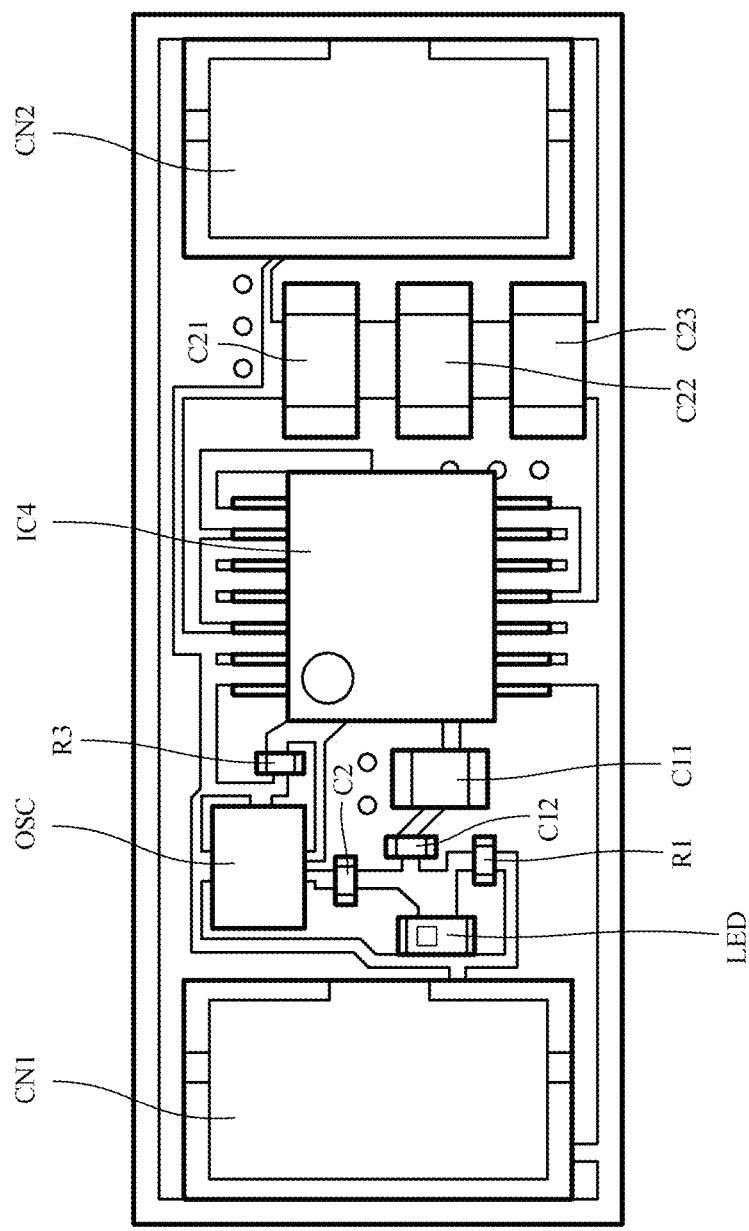
FIG. 9 is a plan view of a circuit board on which a power transmission circuit according to the third embodiment has been formed.

FIG. 8A is a circuit diagram of a power transmission device according to the third embodiment, and FIG. 8B is a diagram illustrating the connection relationship between components including an IC in the circuit illustrated in FIG. 8A. FIG. 9 is a plan view of a circuit board on which a power transmission circuit according to the third embodiment has been formed. An input power supply of, for example, 5 V is connected to the connector CN1. The power transmission coil L12 is connected to the connector CN2.

An oscillation circuit OSC is a single component that includes the oscillator XO and a buffer amplifier AMP. A circuit that includes an LED and the resistor R1 is connected between a power line and a power supply terminal of the oscillation circuit OSC. A smoothing capacitor C2 is connected between the power supply terminal of the oscillation circuit OSC and a ground.

The smoothing capacitor C11 and the high-frequency filter capacitor C12 are connected between the power line and the ground. In addition, the standard logic IC (IC4) is connected between the power line and the ground. The IC4 has the four NAND gates (NAND1, NAND2, NAND3, NAND4) connected in parallel. The output of the oscillation circuit OSC is input to a parallel circuit having the four NAND gates via the resistor R3. In FIG. 8B, the numbers illustrated around the IC4 are terminal numbers of the standard logic IC having the four NAND gates therein. A parallel circuit that includes capacitors C21, C22, and C23 is connected in series between the output of the parallel circuit having the four NAND gates and the connector CN2. The parallel circuit including the capacitors C21, C22, and C23 acts as a power-transmission resonance capacitor.

When the oscillation circuit OSC is in an oscillating state, the LED is turned on by the current consumed by the oscillation circuit OSC. Accordingly, it can be determined whether the oscillation circuit OSC is in the oscillating state by the state of the LED.

In FIG. 9, the reference signs of the components on the board correspond to those of the components illustrated in FIG. 8B. As illustrated in FIG. 9, according to the present embodiment, a power transmission circuit can be formed on a very small single circuit board with a small number of necessary components.

According to the present embodiment, as a result of a power circuit section being formed of a parallel connection circuit having four two-input NAND gates, an output current (a sink current and a source current) increases, and power to be supplied increases.

Fourth Embodiment

In a fourth embodiment, a power transmission circuit that uses a standard logic IC having six NOT gates therein and the like will be described.

Figure 10:
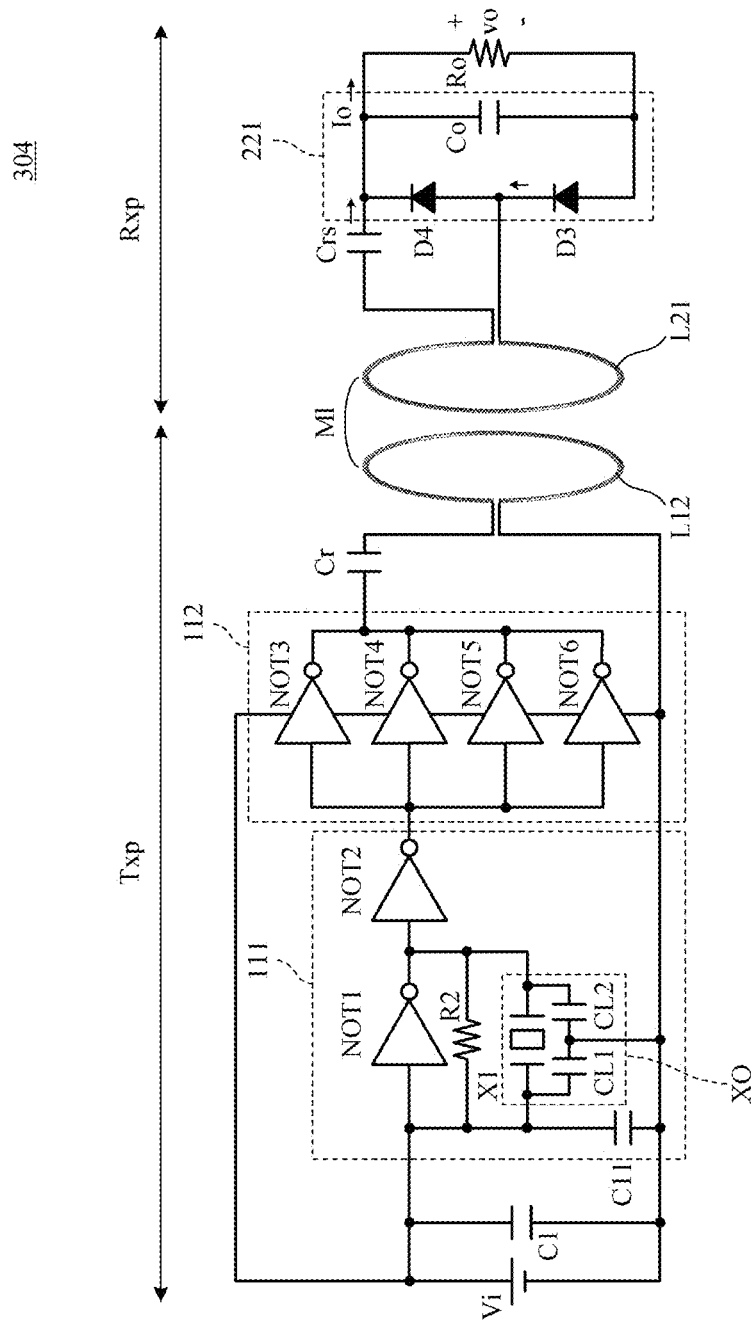
FIG. 10 is a circuit diagram of a wireless power transfer system 304 according to a fourth embodiment.
Figure 11:
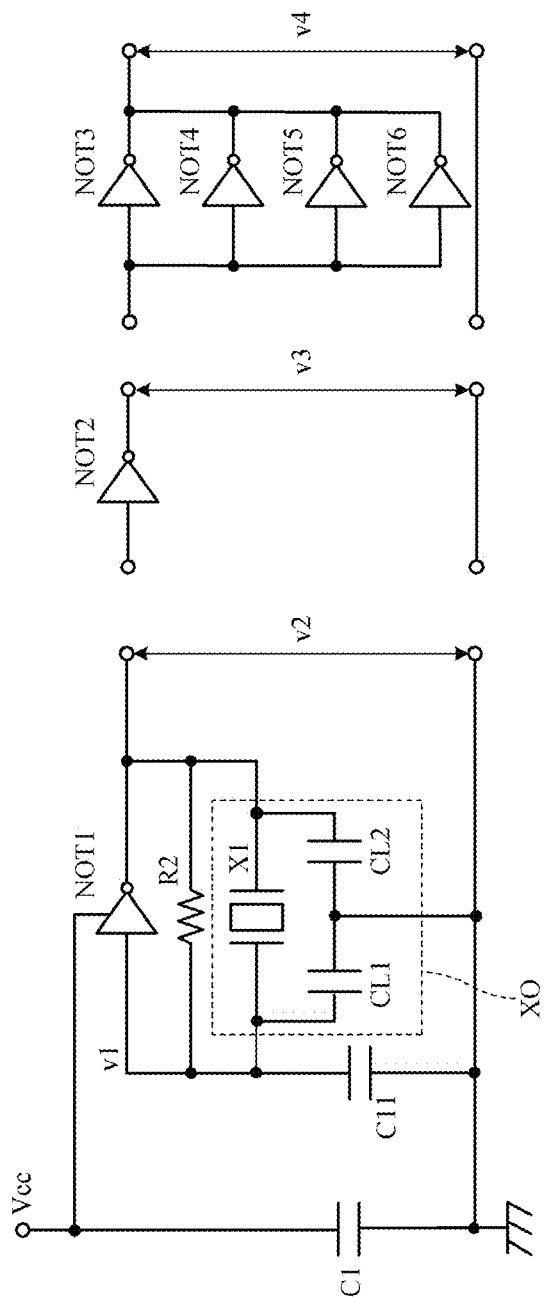
FIG. 11 is an exploded view illustrating a configuration of a power transmission circuit illustrated in FIG. 10.

FIG. 10 is a circuit diagram of a wireless power transfer system 304 according to the fourth embodiment. FIG. 11 is an exploded view illustrating the configuration of a power transmission circuit illustrated in FIG. 10.

The power circuit section 112 is formed of a portion of an integrated circuit that is sealed in a small-sized package with a plurality of terminals, and the integrated circuit is electrically and directly connected to a power-transmission resonance mechanism that is formed of the power transmission coil L12 and the power-transmission resonance capacitor Cr. The control circuit section 111 includes the oscillator (crystal unit) X1. The control circuit section 111 oscillates at a predetermined frequency and outputs a driving signal to the power circuit section 112.

The control circuit section 111 and the power circuit section 112 are formed of a complementary metal oxide semiconductor (CMOS) standard logic IC or a transistor-transistor logic (TTL) standard logic IC that includes a plurality of gate circuits and that is sealed in a single small-sized package with a plurality of terminals. The present embodiment employs a standard logic IC that has six NOT gates in a single package.

The control circuit section 111 includes an oscillation circuit that includes a NOT gate (NOT1), which is one of the six NOT gates, and an oscillator XO and a driving circuit that includes a NOT gate (NOT2), which is another one of the six NOT gates. An output signal from the oscillation circuit is input to the NOT gate (NOT2), and the NOT gate (NOT2) outputs a driving signal to the power circuit section 112.

The power circuit section 112 includes the remaining NOT gates (NOT3, NOT4, NOT5, NOT6) among the six NOT gates. The four NOT gates (NOT3, NOT4, NOT5, NOT6) are connected in parallel. In other words, input terminals, output terminals, power supply terminals, ground terminals of the NOT gates (NOT3, NOT4, NOT5, NOT6) are connected in parallel.

Figure 12A:
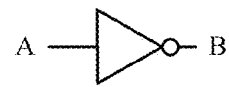
FIG. 12A is a circuit symbol of a NOT gate, and FIG. 12B a diagram illustrating a TTL circuit.
Figure 12B:
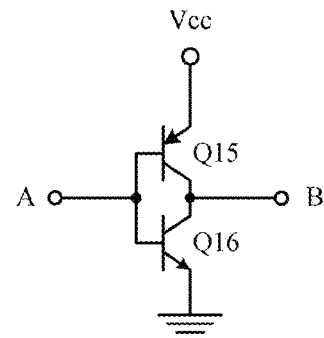
FIG. 12C is a diagram illustrating a CMOS circuit.
Figure 12C:
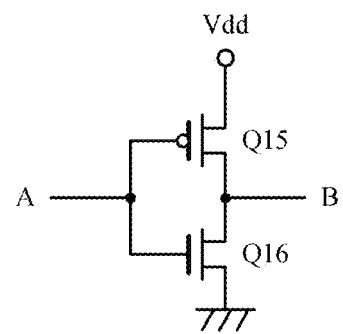

FIG. 12A illustrates a circuit symbol of each of the above-mentioned NOT gates. FIG. 12B is a diagram illustrating a TTL circuit, and FIG. 12C is a diagram illustrating a CMOS circuit. According to the present embodiment, each of the NOT gates is a logic gate circuit that outputs the NOT B of the input A by using transistors Q15 and Q16. The most basic CMOS circuit is the NOT gate illustrated in FIG. 12C.

In FIG. 10 and FIG. 11, the oscillator XO is a single component that includes the oscillator (crystal unit) X1 and the capacitors CL1 and CL2. The NOT gate NOT1 and the feedback resistor R2 form an inverting amplifier circuit, and the inverting amplifier circuit, the oscillator X1, and the capacitors CL1, CL2, and C11 form a Colpitts oscillation circuit. The oscillation frequency of this oscillation circuit is set by the inductive reactance between the resonant frequency and the anti-resonant frequency of the oscillator X1 and the capacitances of the capacitors CL1, CL2, and C11. The resonant frequency of the oscillator X1 and the oscillation frequency are substantially equal to each other.

The waveforms of the voltages v1, v2, and v3 in FIG. 11 are the same as those in the power transmission circuit according to the first embodiment, which is illustrated in FIG. 3.

According to the present embodiment, an output unit (output stage) of the power circuit section is formed of two transistors that are bridge-connected between a power supply and a ground, and thus, the symmetry of a source current and a sink current with respect to a power-transmission resonance mechanism is enhanced, and a resonance current flows with higher efficiency. In other words, power transmission efficiency is improved.

Fifth Embodiment

Figure 13:
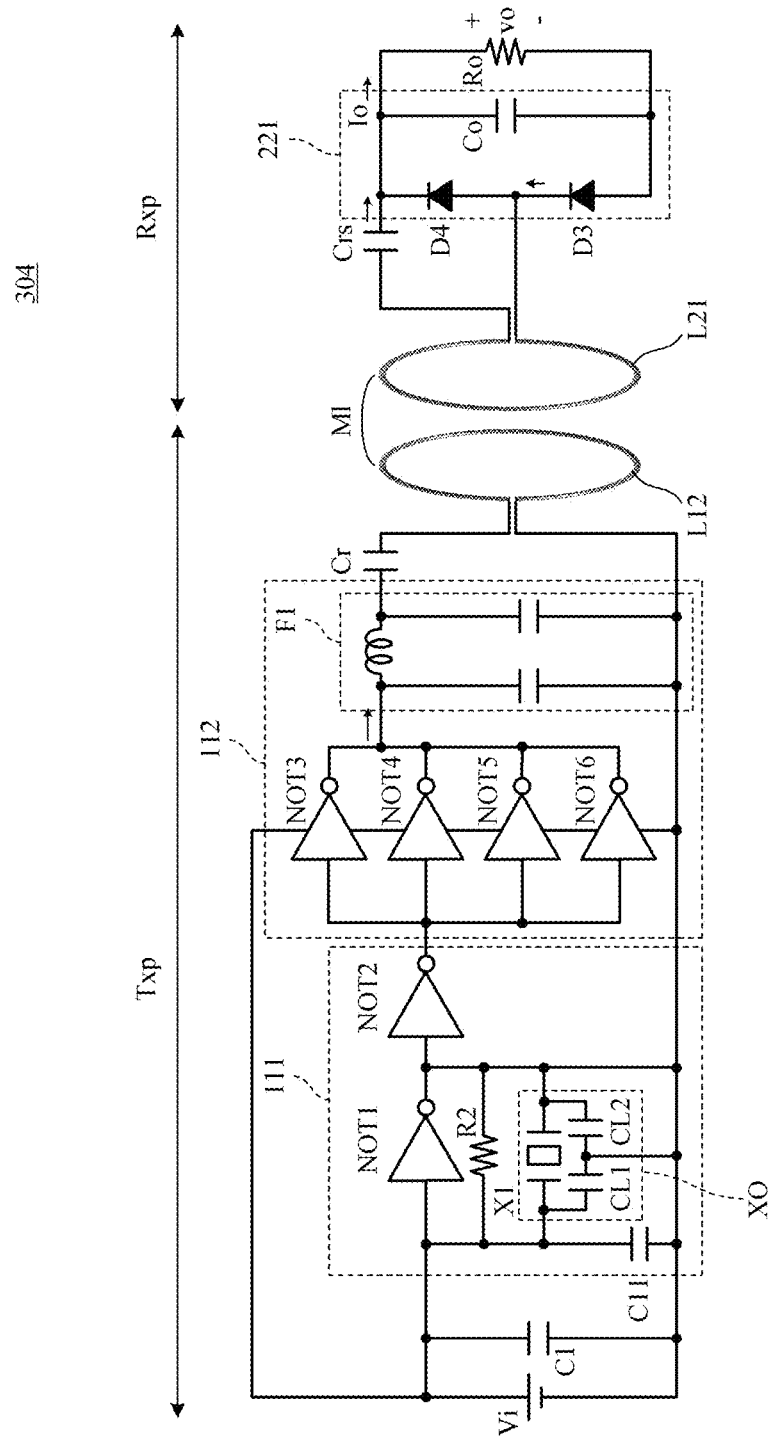
FIG. 13 is a circuit diagram of a wireless power transfer system according to a fifth embodiment.
Figure 14:
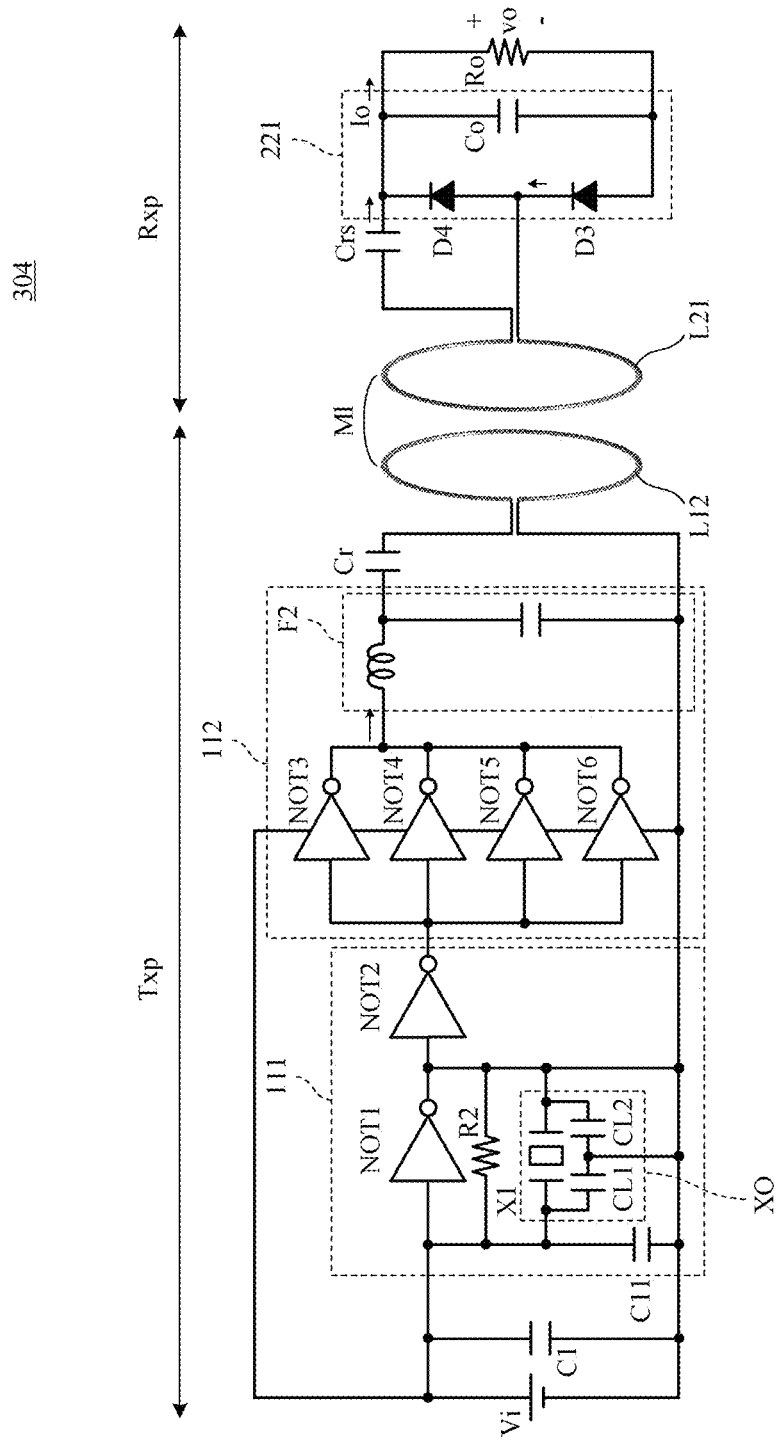
FIG. 14 is a circuit diagram of another wireless power transfer system according to the fifth embodiment.
Figure 15:
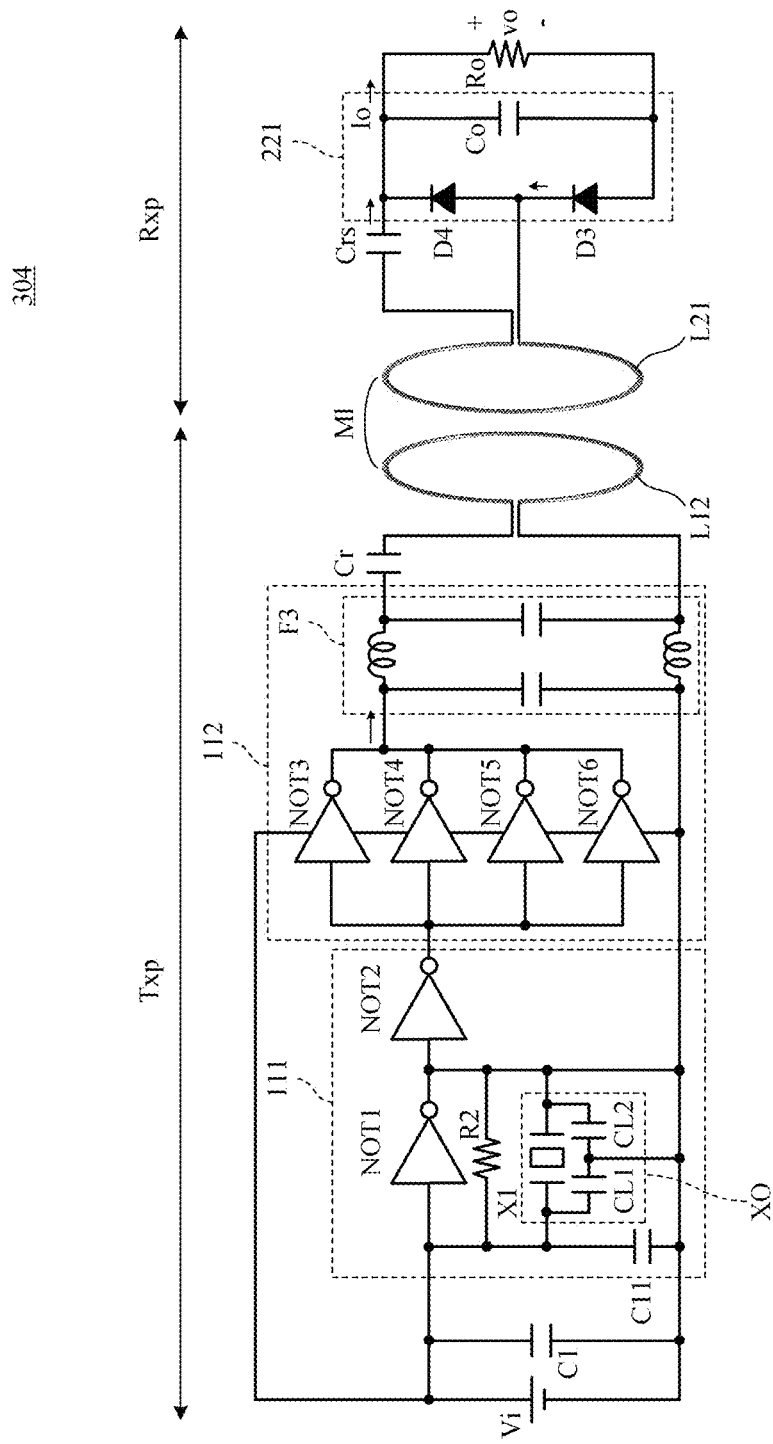
FIG. 15 is a circuit diagram of another wireless power transfer system according to the fifth embodiment.

In a fifth embodiment, an example of a power transmission circuit that includes a filter will be described. FIG. 13, FIG. 14, and FIG. 15 are circuit diagrams of wireless power transfer systems according to the fifth embodiment. In each of the wireless power transfer systems, a filter circuit that enables a current at a switching frequency to flow therethrough and suppresses a harmonic current is provided at the final stage of a power circuit section. In other words, a filter is provided between a resonance mechanism, which includes the power-transmission resonance capacitor Cr and the power transmission coil L12, and the power circuit section 112 of a power transmission device. The rest of the configuration of each of the wireless power transfer systems is the same as that of the wireless power transfer system according to the fourth embodiment, which is illustrated in FIG. 10.

In the example illustrated in FIG. 13, a CLC π-type low-pass filter F1 is provided. In the example illustrated in FIG. 14, an LC L-type low-pass filter F2 is provided. In the example illustrated in FIG. 15, a linear low-pass filter F3 that includes capacitors connected in parallel and inductors connected in series is provided.

The cutoff frequency of each of the above-mentioned low-pass filters F1, F2, and F3 is set between the oscillation frequency of an oscillation circuit and its harmonic frequency. As a result, a harmonic component is suppressed, and generation of electromagnetic noise can be suppressed even in a high-frequency, high-speed operation.

Sixth Embodiment

In a sixth embodiment, a case will be described in which a power circuit section is formed of a FET driving driver IC sealed in a small-sized package.

Figure 16:
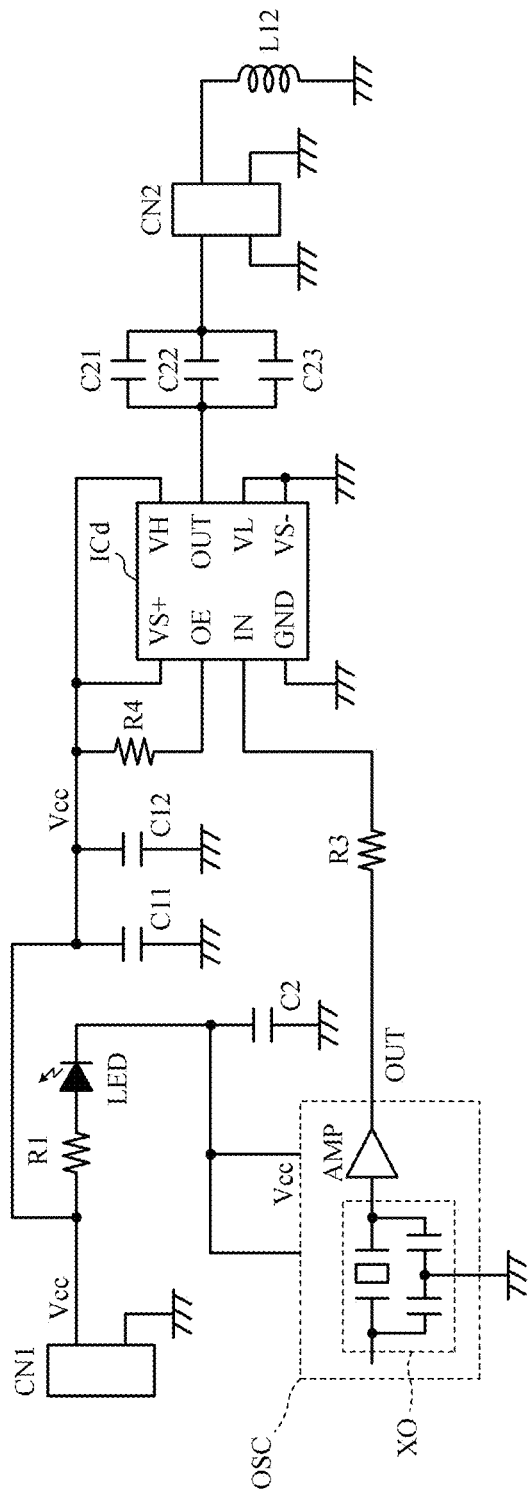
FIG. 16 is a circuit diagram of a power transmission device according to a sixth embodiment.
Figure 17:
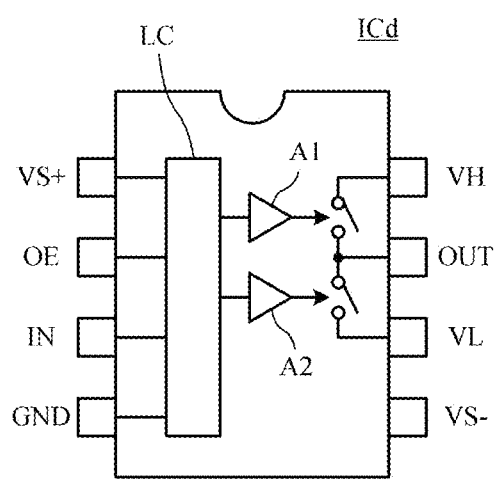
FIG. 17 is a diagram illustrating a connection relationship between an internal circuit and terminals of a field effect transistor (FET) driver IC (ICd)
Figure 18:
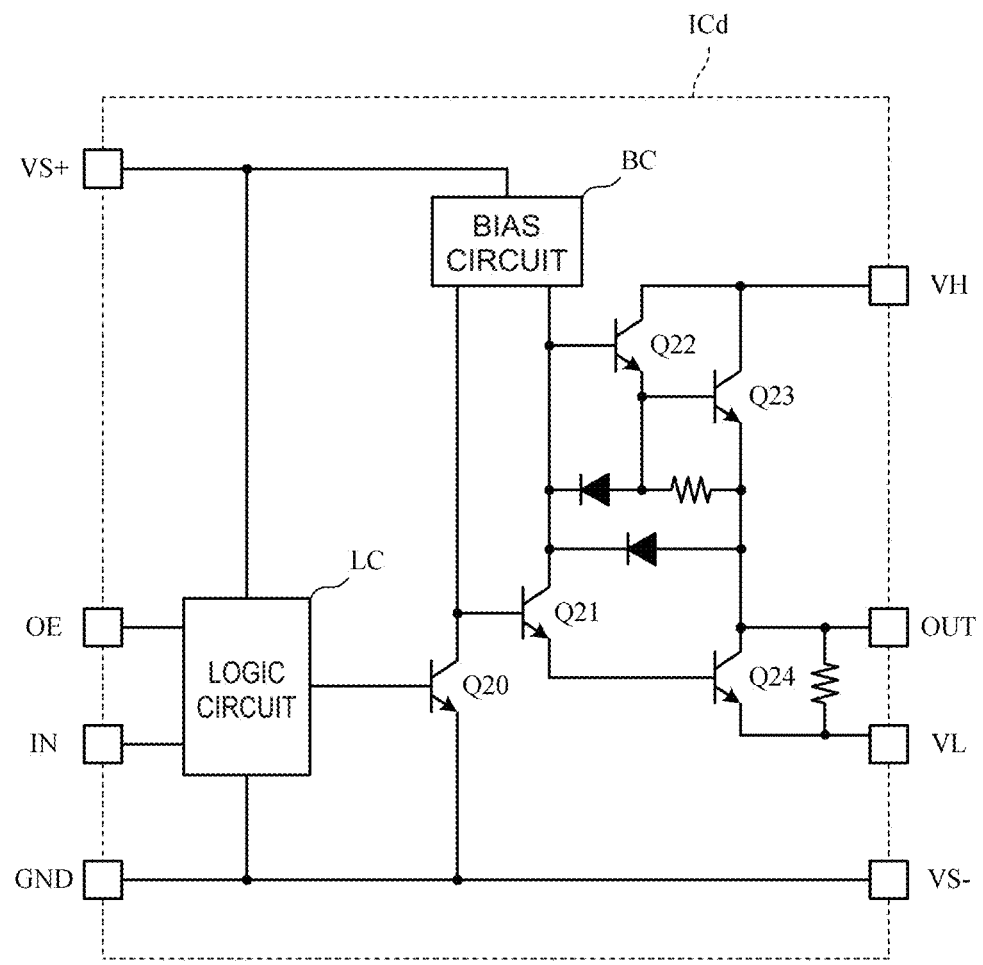
FIG. 18 is a circuit diagram illustrating a circuit configuration of the FET driver IC (ICd)
Figure 19:
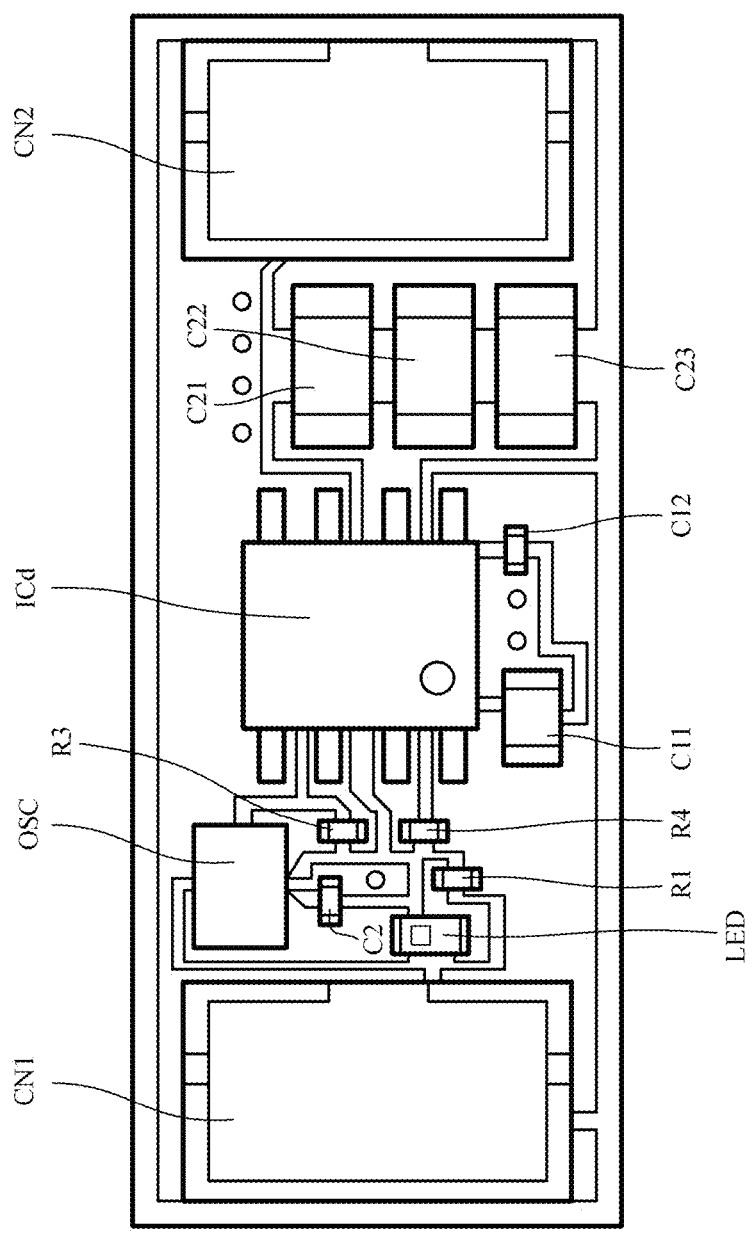
FIG. 19 is a plan view of a circuit board on which a power transmission circuit according to the sixth embodiment has been formed.

FIG. 16 is a circuit diagram of a power transmission device according to the sixth embodiment. FIG. 17 is a diagram illustrating the connection relationship between an internal circuit and terminals of a FET driver IC (ICd). FIG. 18 is a circuit diagram illustrating the circuit configuration of the FET driver IC (ICd). FIG. 19 is a plan view of a circuit board on which a power transmission circuit according to the sixth embodiment has been formed.

In the power transmission circuit according to the third embodiment, which is illustrated in FIG. 8, the power circuit section is formed of the standard logic IC (IC4). In contrast, the power circuit section according to the present embodiment is formed of the FET driver IC (ICd). The rest of the configuration of the power circuit section is the same as the configuration according to the third embodiment.

As illustrated in FIG. 17, the FET driver IC (ICd) includes a logic circuit LC and amplifier circuits A1 and A2. A terminal VS+, a terminal VS−, and a terminal GND of the FET driver IC (ICd) are a positive power-supply voltage input terminal, a negative power-supply voltage input terminal, and a ground terminal, respectively. A terminal VH is a high-level voltage input terminal, and a terminal VL is a low-level voltage input terminal. A terminal IN is a square-wave signal input terminal, and a terminal OE is an output enable signal input terminal. A terminal OUT is a FET driving signal output terminal. Note that, in the present embodiment, a power-transmission resonance mechanism is connected to the terminal OUT as illustrated in FIG. 16.

Specifically, the FET driver IC (ICd) is configured as illustrated in FIG. 18. The logic circuit LC outputs a high level when the terminal OE and the terminal IN are at a high level; otherwise, the output of the logic circuit LC is brought to a low level.

When the input of a transistor Q20 is at a high level, a transistor Q21 is brought into the OFF state, and a transistor Q22 is brought into the ON state. Accordingly, a transistor Q23 is brought into the ON state, and a transistor Q24 is brought into the OFF state. In this state, a source current flows along a route that passes through the terminal VH, the transistor Q23, and the terminal OUT in this order. When the input of the transistor Q20 is at a low level, the transistor Q21 is brought into the ON state, and the transistor Q22 is brought into the OFF state. Accordingly, the transistor Q23 is brought into the OFF state, and the transistor Q24 is brought into the ON state. In this state, a sink current flows along a route that passes through the terminal OUT, the transistor Q24, and the terminal VL in this order.

Note that, in FIG. 16, the operating voltage of the oscillation circuit OSC and the power supply voltage (input voltage) of the FET driver IC (ICd) may be different voltage values. For example, by increasing the power supply voltage (input voltage) of the FET driver IC (ICd), the amount of power to be transmitted can be increased.

In FIG. 19, the reference signs of the components on the board correspond to the reference signs of the components illustrated in FIG. 16. As illustrated in FIG. 19, according to the present embodiment, a power transmission circuit can be formed on a very small single circuit board with a small number of necessary components.

Seventh Embodiment

In a seventh embodiment, a case will be described in which a power circuit section that performs a class-E switching operation is formed of a FET driving driver IC sealed in a small-sized package.

Figure 20:
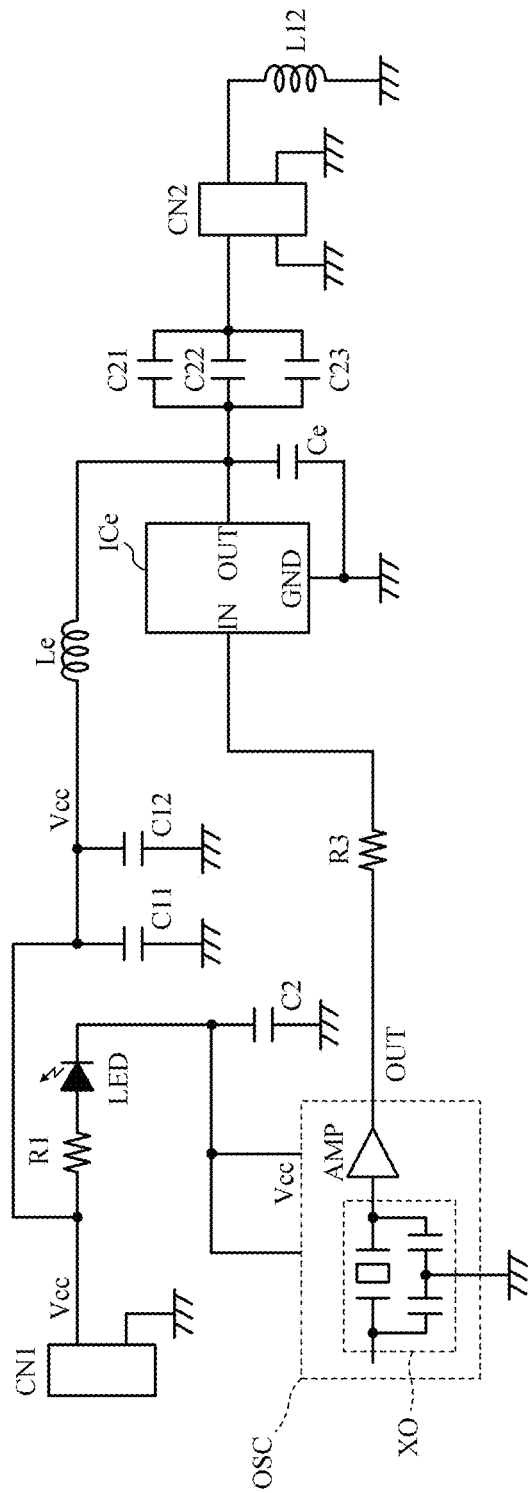
FIG. 20 is a circuit diagram of a power transmission device according to a seventh embodiment.
Figure 21:
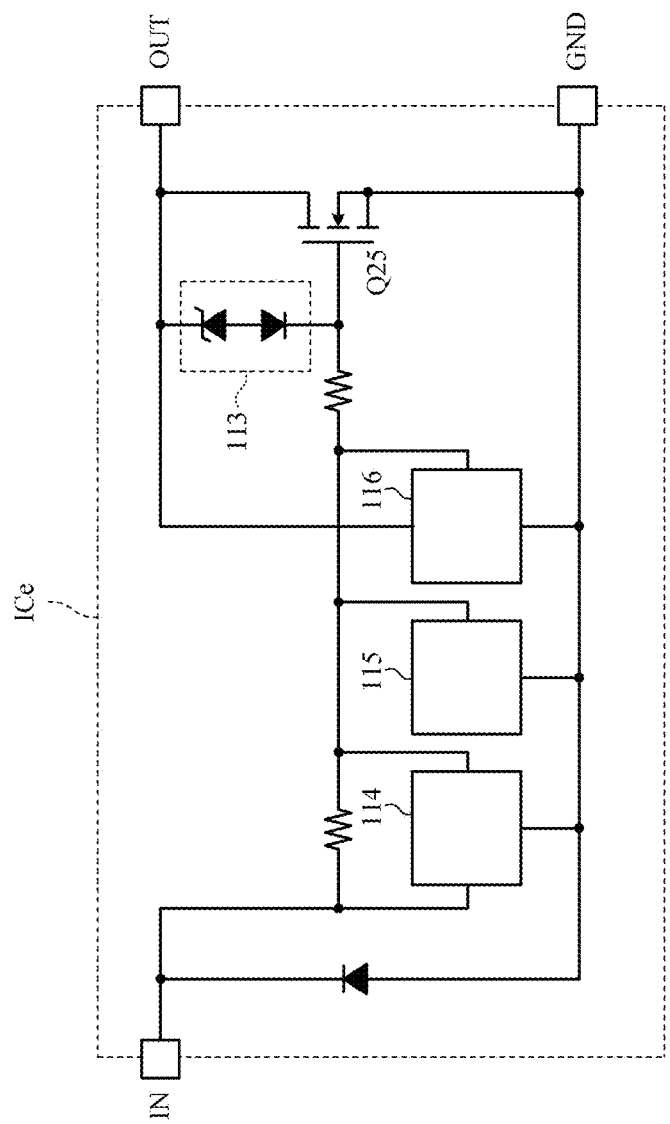
FIG. 21 is a circuit diagram illustrating a circuit configuration of a FET driver IC (ICe) illustrated in FIG. 20.

FIG. 20 is a circuit diagram of a power transmission device according to the seventh embodiment. FIG. 21 is a circuit diagram illustrating the circuit configuration of a FET driver IC (ICe).

In the sixth embodiment, the power transmission circuit is formed by using a class-D switching circuit. In contrast, in the present embodiment, a class-E switching circuit using a single FET is formed.

In FIG. 20, the oscillation circuit OSC is a single component that includes the oscillator XO and the buffer amplifier AMP. A circuit that includes an LED and the resistor R1 is connected between a power line and the power supply terminal of the oscillation circuit OSC. The smoothing capacitor C2 is connected between the power supply terminal of the oscillation circuit OSC and a ground.

The smoothing capacitor C11 and the high-frequency filter capacitor C12 are connected between the power line and the ground. A series circuit that includes an inductor Le and a capacitor Ce is connected between the power line and the ground.

The output of the oscillation circuit OSC is connected to an input terminal IN of the FET driver IC (ICe) via the resistor R3. An output terminal OUT of the FET driver IC (ICe) is connected to a connection point between the inductor Le and the capacitor Ce. The parallel circuit that includes the capacitors C21, C22, and C23 is connected in series between the output terminal OUT of the FET driver IC (ICe) and the connector CN2. The parallel circuit including the capacitors C21, C22, and C23 acts as a power-transmission resonance capacitor. The capacitor Ce, the parallel circuit including the capacitors C21, C22, and C23, and the power transmission coil L12 form a power-transmission resonance mechanism.

Specifically, the FET driver IC (ICe) is configured as illustrated in FIG. 21. A MOS-FET Q25 is connected between the terminal OUT and a terminal GND. The voltage at a terminal IN is applied as a gate signal of the MOS-FET Q25.

In the example illustrated in FIG. 21, a dynamic clamping circuit 113 is connected between the drain and the gate of the MOS-FET Q25. In addition, various protection circuits and control circuits 114, 115, and 116 are provided between the gate signal line of the MOS-FET Q25 and the ground.

The inductor Le illustrated in FIG. 20 substantially functions as an inductor that enables direct current to flow therethrough. The capacitor Ce, the parallel circuit including the capacitors C21, C22, and C23, and the power transmission coil L12 form the power-transmission resonance mechanism. An average substantial resonant frequency in a switching operation is equal to the oscillation frequency of the oscillation circuit OSC. Therefore, as a result of the MOS-FET Q25 being turned on and off, a resonance current flows through a power transmission coil 12, and a half-wave sinusoidal resonance voltage is output from the terminal OUT.

As described above, the power transmission circuit may also be formed of a class-E switching circuit.

Eighth Embodiment

In an eighth embodiment, a case will be described in which a circuit that is directly connected to a power-transmission resonance mechanism includes a high-side MOS-FET and a low-side MOS-FET, and operation of the circuit will be described.

Figure 22:
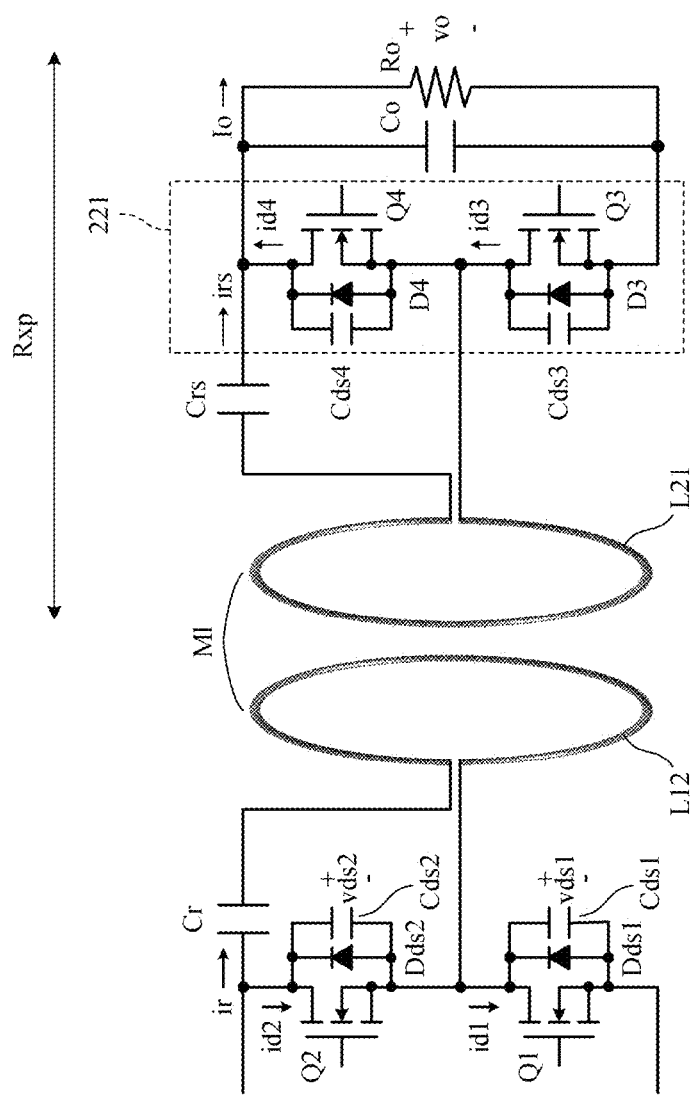
FIG. 22 is a partial circuit diagram of a wireless power transfer system according to an eighth embodiment.

FIG. 22 is a partial circuit diagram of a wireless power transfer system according to the eighth embodiment. In FIG. 22, the final stage of a circuit that is connected to a power-transmission resonance mechanism, which is formed of the power transmission coil L12 and the power-transmission resonance capacitor Cr, is formed of a high-side MOS-FET Q2 and a low-side MOS-FET Q1. This circuit is the final stage of a FET driver IC. In addition, in the example illustrated in FIG. 22, the rectifying-and-smoothing circuit 221 of the power reception device Rxp includes a synchronous rectifier circuit that includes MOS-FETs Q3 and Q4. The MOS-FET Q1 includes a parasitic diode Dds1 and parasitic capacitance Cds1, and the MOS-FET Q2 includes a parasitic diode Dds2 and parasitic capacitance Cds2. The MOS-FET Q3 includes a parasitic diode Dds3 and parasitic capacitance Cds3, and the MOS-FET Q4 includes a parasitic diode Dds4 and parasitic capacitance Cds4.

The circuit of the above-mentioned final stage corresponds to, for example, the final stage of the FET driver IC.

Figure 23:
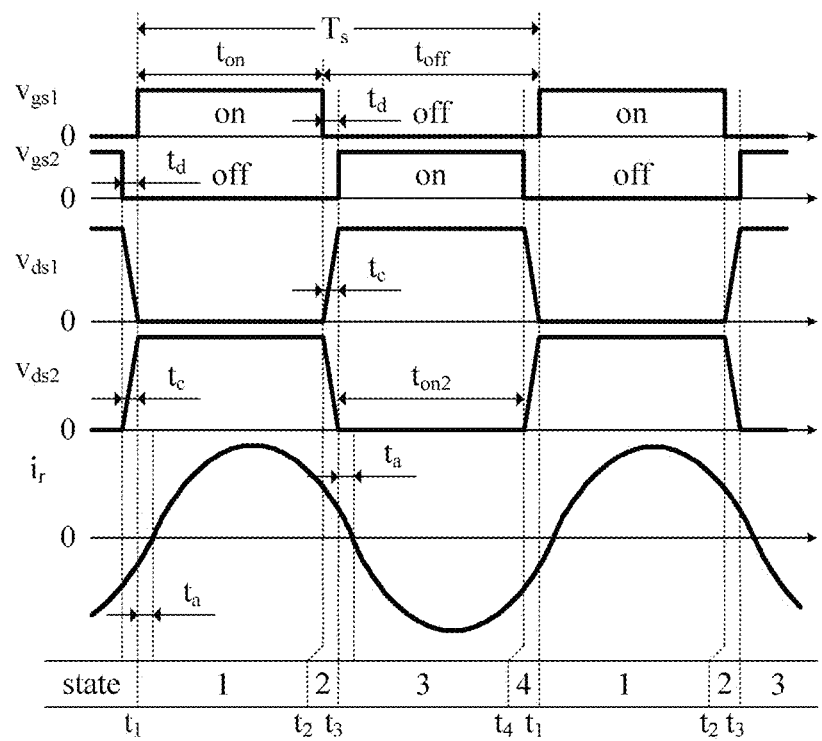
FIG. 23 is a diagram illustrating voltage and current waveforms in each component illustrated in FIG. 22.

FIG. 23 is a diagram illustrating voltage and current waveforms in each component illustrated in FIG. 22. The operating state of a power transmission circuit can be classified into four states, which are an ON period, an OFF period, and two commutation periods, for each equivalent circuit. The gate-source voltage of the FET Q1 and the gate-source voltage of the FET Q2 will hereinafter be referred to as a voltage vgs1 and a voltage vgs2, respectively. The drain-source voltage of the FET Q1 and the drain-source voltage of the FET Q2 will hereinafter be referred to as a voltage vds1 and a voltage vds2, respectively. A resonance frequency fr of a multi-resonant circuit including electromagnetic field coupling is designed to be slightly lower than 6.78 MHz, and the multi-resonant circuit is configured to have a sufficiently small inductive reactance. The FETs Q1 and Q2 are alternately turned on and off with a short dead time in which both the FETs Q1 and Q2 are turned off. In a dead time td, in which the two FETs are turned off, commutation is performed by charging and discharging the parasitic capacitances Cds1 and Cds2 of the two FETs by using a lagging current of the resonance current ir. A zero-voltage-switching (ZVS) operation is performed by turning on the FETs in a parasitic-diode conduction period to after a commutation period tc has passed. As described above, by passing the lagging current, which lags the voltage, a switching speed can be increased and a switching time can be reduced.

An energy conversion operation in each state in one switching period will be described below.

(1) State 1, Time t1 to Time t2

The FET Q1 is in conduction on a power transmitting side. The equivalent diode Dds1 between the ends of the FET Q1 is turned on, and the ZVS operation is performed by turning on the FET Q1 during this period. The resonance current ir flows through the power transmission coil L12, and the capacitor Cr is charged.

On a power receiving side, the diode D3 or the diode D4 is turned on, and the resonance current irs flows through the power reception coil L21. When the diode D3 is turned on, the capacitor Crs is discharged. The voltage induced in the power reception coil L21 and the voltage across the capacitor Crs are added together, and power is supplied to the load Ro. When the diode D4 is turned on, the capacitor Crs is charged. The voltage of the capacitor Co is applied to the load Ro, and power is supplied to the load Ro. When the FET Q1 is turned off, State 1 shifts to State 2.

(2) State 2, Time t2 to Time t3

By the resonance current ir flowing through the power transmission coil L12, the parasitic capacitance Cds1 of the FET Q1 is charged, and the parasitic capacitance Cds2 of the FET Q2 is discharged. When the voltage vds1 becomes a voltage Vi, and the voltage vds2 becomes 0 V, State 2 shifts to State 3.

(3) State 3, Time t3 to Time t4

The FET Q2 is in conduction on the power transmitting side. The equivalent diode Dds2 between the ends of the FET Q2 is turned on, and the ZVS operation is performed by turning on the FET Q2 during this period. The resonance current ir flows through the power transmission coil L12, and the capacitor Cr is discharged.

On the power receiving side, the diode D3 or the diode D4 is turned on, and the resonance current irs flows through the power reception coil L21. When the diode D3 is turned on, the capacitor Crs is discharged. The voltage induced in the power reception coil L21 and the voltage across the capacitor Crs are added together, and power is supplied to the load Ro. When the diode D4 is turned on, the capacitor Crs is charged. The voltage of the capacitor Co is applied to the load Ro, and power is supplied to the load Ro. When the FET Q2 is turned off, State 3 shifts to State 4.

(4) State 4, Time t4 to Time t1

By the resonance current ir flowing through the power transmission coil L12, the parasitic capacitance Cds1 of the FET Q1 is discharged, and the parasitic capacitance Cds2 of the FET Q2 is charged. When the voltage vds1 becomes 0 V, and the voltage vds2 becomes the voltage Vi, State 4 shifts to State 1 again. Subsequently, States 1 to 4 are periodically repeated.

In a power reception circuit, the diode D3 or the diode D4 is turned on, and a current flows forward so as to rectify. In a periodic steady operation, each of the waveforms of the currents it and irs are substantially sinusoidal due to a resonance phenomenon.

Ninth Embodiment

In a ninth embodiment, an example of a wireless power transfer system that includes a relay device will be described.

Figure 24:
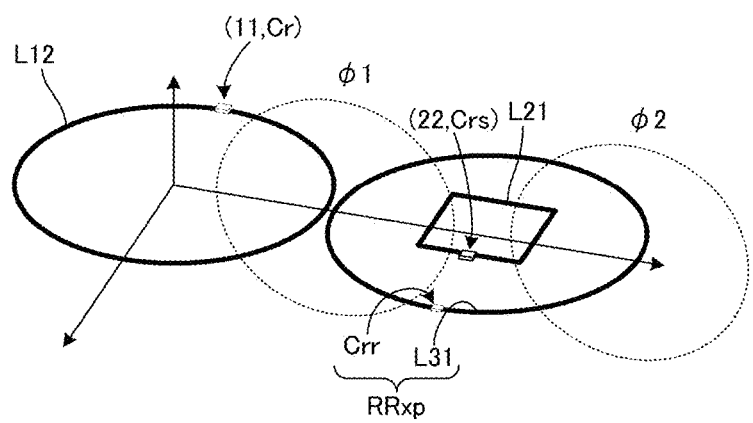
FIG. 24 is a perspective view illustrating the shapes of a power transmission coil L12, a power reception coil L21, and a relay coil L31 of a wireless power transfer system according to a ninth embodiment and the positional relationship between the power transmission coil L12, the power reception coil L21, and the relay coil L31.

FIG. 24 is a perspective view illustrating the shapes of the power transmission coil L12, the power reception coil L21, and a relay coil L31 of a wireless power transfer system according to the ninth embodiment and the positional relationship between the power transmission coil L12, the power reception coil L21, and the relay coil L31. In the present embodiment, the power transmission coil L12 is a single-turn coil having a circular loop shape with a diameter of 500 mm. The power-transmission resonance capacitor Cr and the power transmission circuit 11 are connected to the power transmission coil L12. The power transmission coil L12, the power-transmission resonance capacitor Cr, and the power transmission circuit 11 form a power transmission device. The configurations of the power transmission circuit 11 and the power reception circuit 22 are the same as those described in the first embodiment and the like.

The relay coil L31 is a single-turn coil having a circular loop shape with a diameter of 500 mm. A relay resonance capacitor Crr is connected to the relay coil L31. The relay coil L31 and the relay resonance capacitor Crr form a relay device RRxp.

The power reception coil L21 is a loop coil having a square shape or a rectangular shape. The power-reception resonance capacitor Crs and the power reception circuit 22 are connected to the power reception coil L21. The power reception coil L21, the power-reception resonance capacitor Crs, and the power reception circuit 22 form a power reception device. The power reception device is disposed in a space enclosed by the relay coil L31.

The relay coil L31 and the relay resonance capacitor Crr form a relay resonance mechanism. The resonant frequency solely used by the relay resonance mechanism is substantially equal to the resonant frequency solely used by the power-transmission resonance mechanism, which is formed of the power transmission coil L12 and the power-transmission resonance capacitor Cr. In addition, the resonant frequency solely used by the relay resonance mechanism is substantially equal to the resonant frequency solely used by the power-reception resonance mechanism, which is formed of the power reception coil L21 and the power-reception resonance capacitor Crs.

Electric field energy and magnetic field energy of each of the power-transmission resonance mechanism, the power-reception resonance mechanism, and the relay resonance mechanism interact with each other so as to form an electromagnetic resonance field. As a result, electromagnetic field resonance coupling is formed of magnetic field coupling and electric field coupling between the power transmission coil L12, the power reception coil L21, and the relay coil L31.

Figure 25:
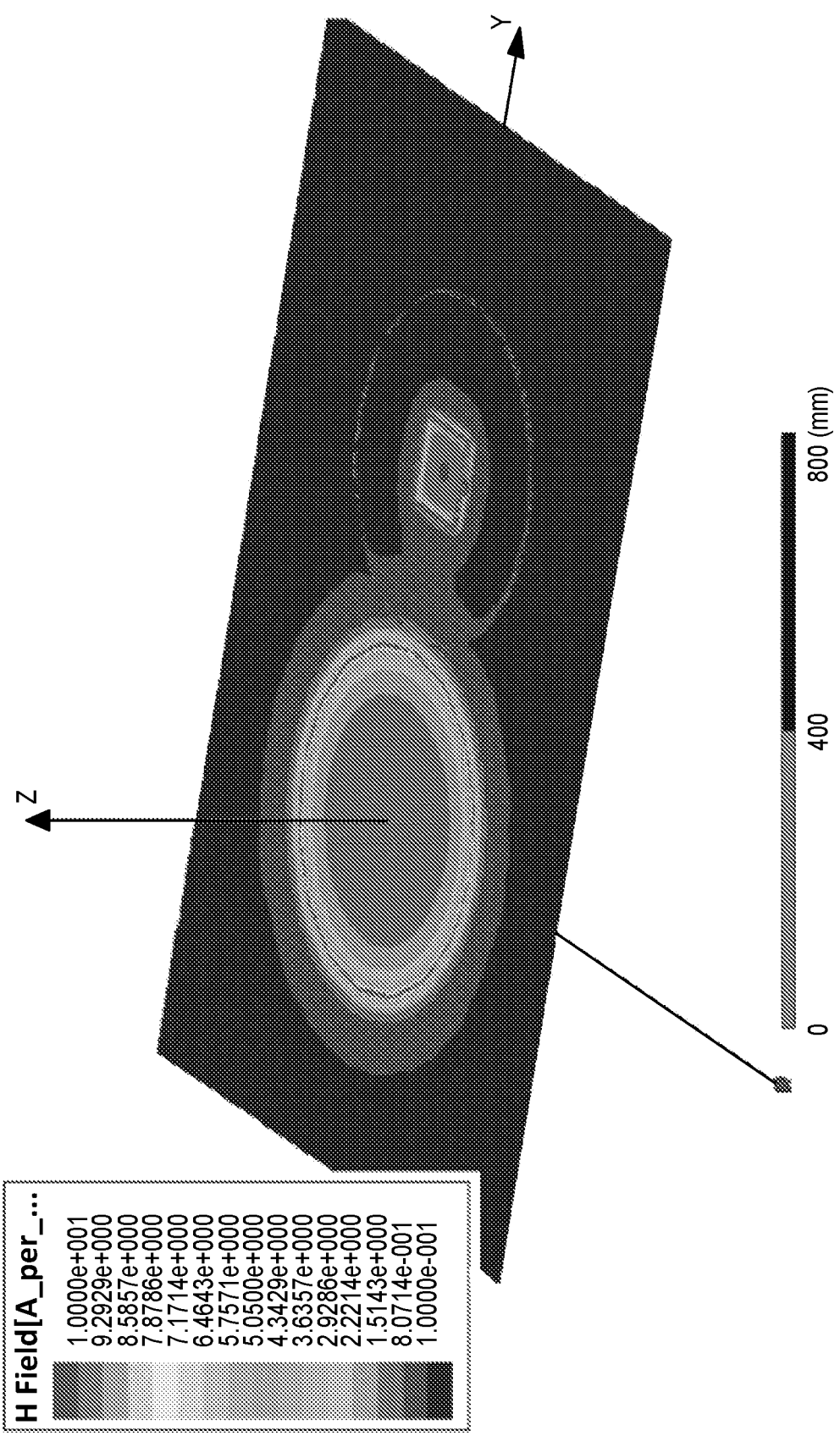
FIG. 25 is a contour diagram illustrating an example of the magnetic field intensity of each of the power transmission coil L12, the power reception coil L21, and the relay coil L31.

FIG. 25 is a contour diagram illustrating an example of the magnetic field intensity of each of the power transmission coil L12, the power reception coil L21, and the relay coil L31.

In FIG. 24, the magnetic field coupling relationship between the power transmission coil L12 and the relay coil L31 is represented by a magnetic flux φ1. The magnetic field coupling relationship between the relay coil L31 and the power reception coil L21 is represented by a magnetic flux φ2. In addition, the magnetic field coupling relationship between the power transmission coil L12 and the power reception coil L21 is represented by the magnetic flux φ1.

According to the present embodiment, the electromagnetic resonance field is expanded by the relay device, and a spatial region in which wireless power transfer is desired to be realized can be expanded.

Figure 26:
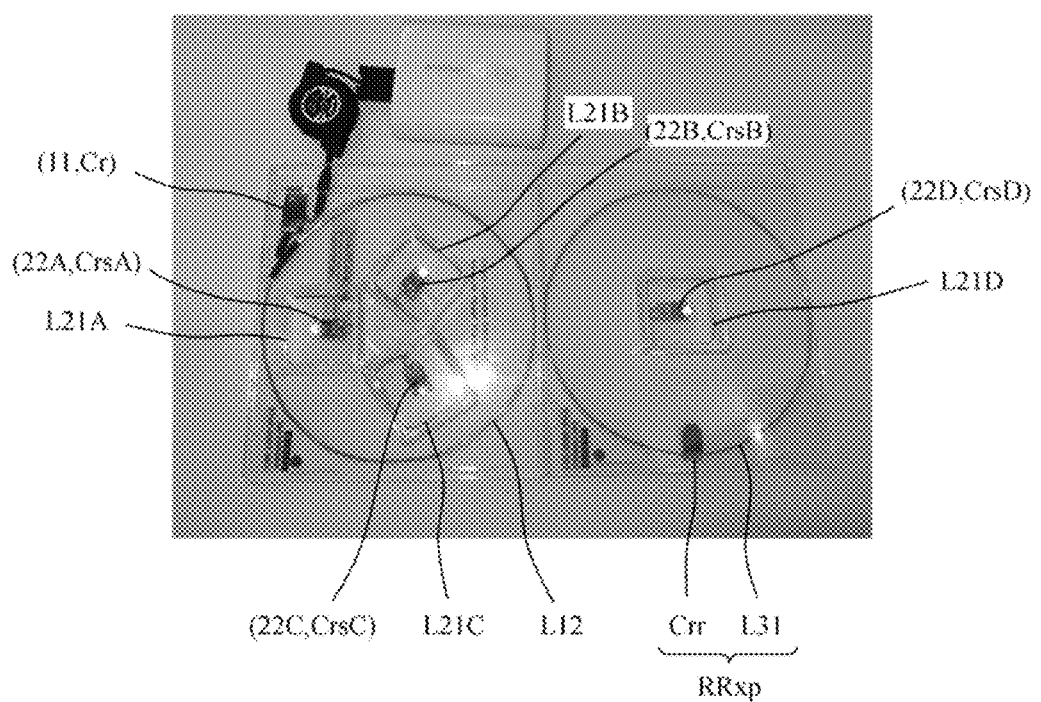
FIG. 26 is a perspective view (a photograph) of a wireless power transfer system that includes a plurality of power reception devices.

FIG. 26 is a perspective view (a photograph) of a wireless power transfer system that includes a single power transmission device and a plurality of power reception devices. In this example, three power reception devices are disposed in a space enclosed by the power transmission coil L12. In addition, another power reception device is disposed in a space enclosed by the relay coil L31. The power transmission coil L12, the power-transmission resonance capacitor Cr, and the power transmission circuit 11 form a power transmission device. A power reception coil L21A, a power-reception resonance capacitor CrsA, and a power reception circuit 22A form a first power reception device. Similarly, a power reception coil L21B, a power-reception resonance capacitor CrsB, and a power reception circuit 22B form a second power reception device. A power reception coil L21C, a power-reception resonance capacitor CrsC, and a power reception circuit 22C form a third power reception device. A power reception coil L21D, a power-reception resonance capacitor CrsD, and a power reception circuit 22D form a fourth power reception device. Each of these power reception devices includes an LED serving as a load.

As illustrated in FIG. 26, since the electromagnetic resonance field is expanded by the relay device RRxp, and a spatial region in which wireless power transfer is desired to be realized can be expanded, power can be simultaneously supplied to a larger number of power reception devices.

Tenth Embodiment

In a tenth embodiment, an example of a wireless power transfer system that includes a plurality of relay devices will be described.

Figure 27:
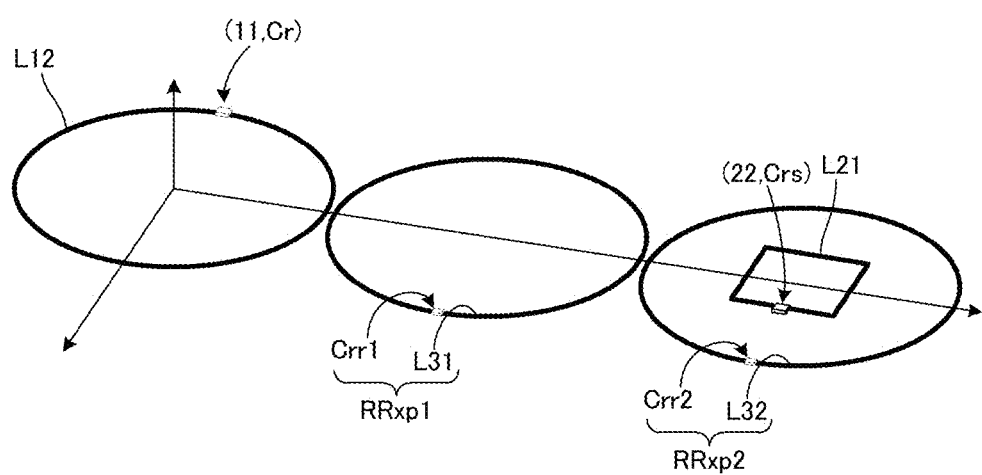
FIG. 27 is a perspective view illustrating the shapes of the power transmission coil L12, the power reception coil L21, the relay coil L31, and the relay coil L32 of a wireless power transfer system according to a tenth embodiment and the positional relationship between the power transmission coil L12, the power reception coil L21, and the relay coils L31 and L32.

FIG. 27 is a perspective view illustrating the shapes of the power transmission coil L12, the power reception coil L21, the relay coil L31, and a relay coil L32 of a wireless power transfer system according to the tenth embodiment and the positional relationship between the power transmission coil L12, the power reception coil L21, and the relay coils L31 and L32.

Each of the relay coils L31 and L32 is a circular loop-shaped coil. The relay coil L31 and a relay resonance capacitor Crr1, which is connected to the relay coil L31, form a first relay device RRxp1, and the relay coil L32 and a relay resonance capacitor Crr2, which is connected to the relay coil L32, form a second relay device RRxp2. Each of the relay devices RRxp1 and RRxp2 has the configuration according to the ninth embodiment, which is illustrated in FIG. 24.

The power reception coil L21 is a loop coil having a square shape or a rectangular shape. The power-reception resonance capacitor Crs and the power reception circuit 22 are connected to the power reception coil L21. The power reception coil L21, the power-reception resonance capacitor Crs, and the power reception circuit 22 form a power reception device. This power reception device is disposed in a space enclosed by the relay coil L32.

Figure 28:
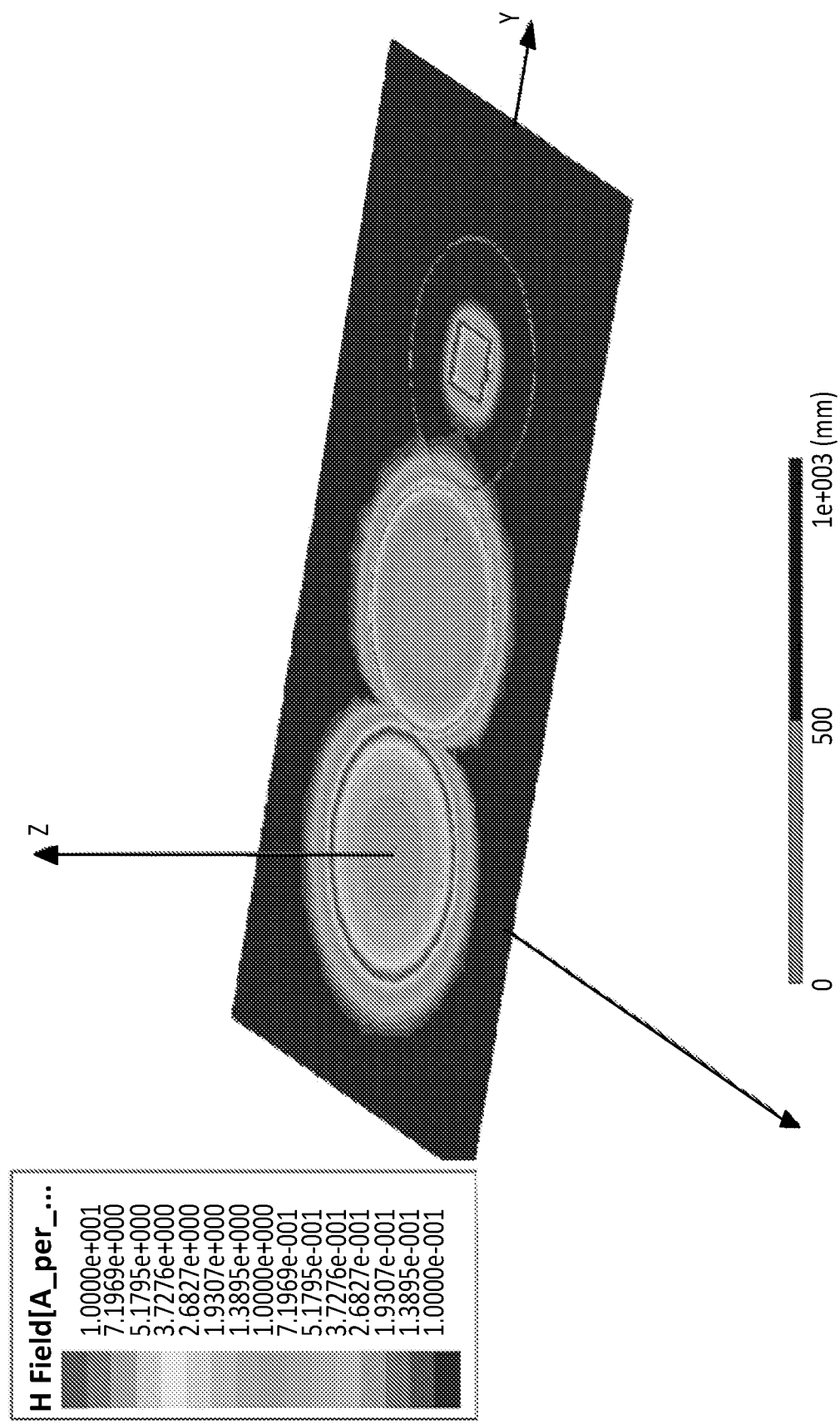
FIG. 28 is a contour diagram illustrating an example of the magnetic field intensity of each of the power transmission coil L12, the power reception coil L21, and the relay coils L31 and L32.

FIG. 28 is a contour diagram illustrating an example of the magnetic field intensity of each of the power transmission coil L12, the power reception coil L21, and the relay coils L31 and L32.

As described above, also in the case where a plurality of relay devices are provided, electric field energy and magnetic field energy of each of a power-transmission resonance mechanism, a power-reception resonance mechanism, and the plurality of relay resonance mechanisms interact with each other so as to form an electromagnetic resonance field. As a result, electromagnetic field resonance coupling is formed of magnetic field coupling and electric field coupling between the power transmission coil L12, the power reception coil L21, and the relay coils L31 and L32.

Figure 29:
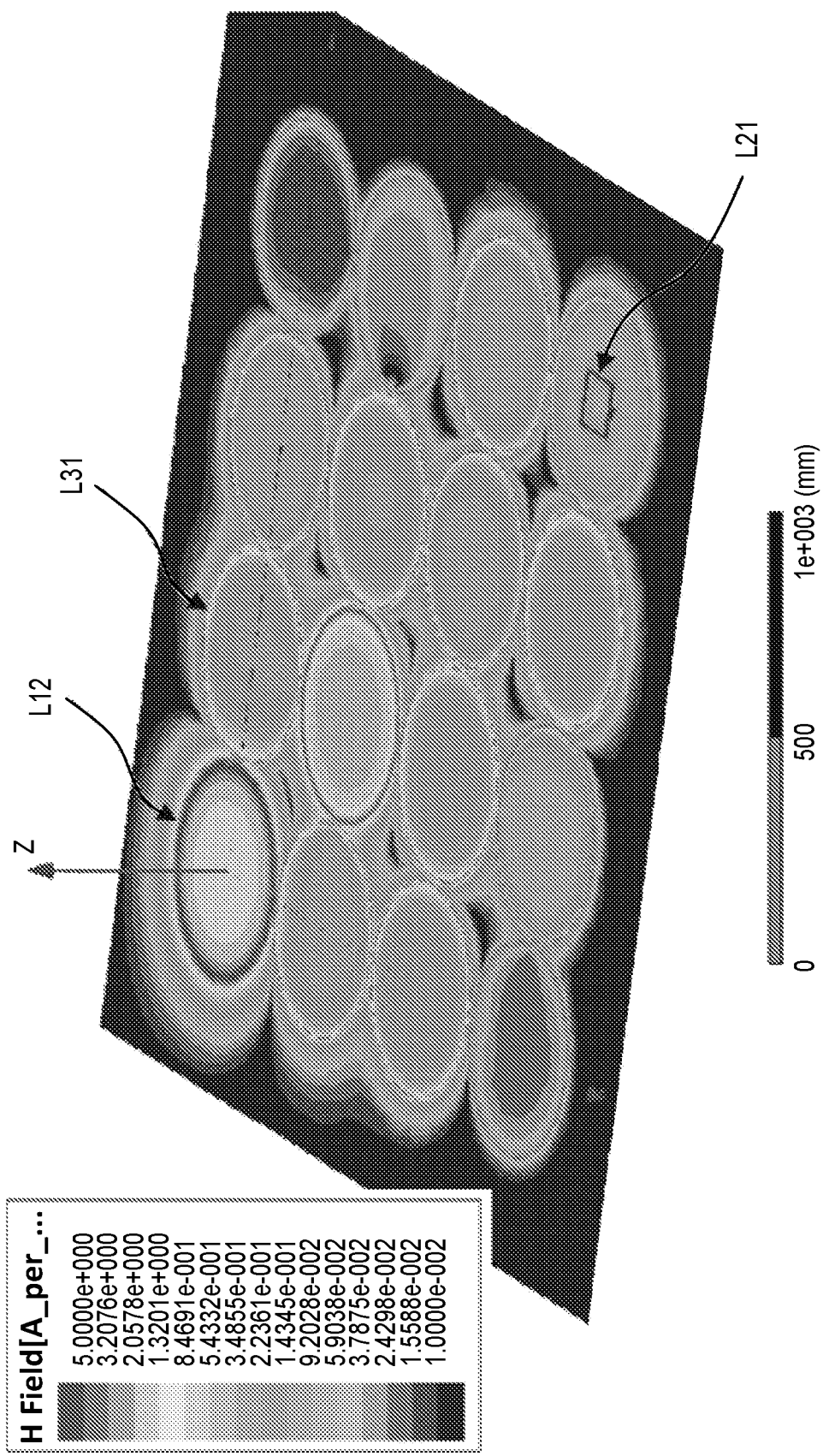
FIG. 29 is a contour diagram illustrating the magnetic field intensity of a wireless power transfer system that includes one power transmission coil and 15 relay coils.
Figure 30:
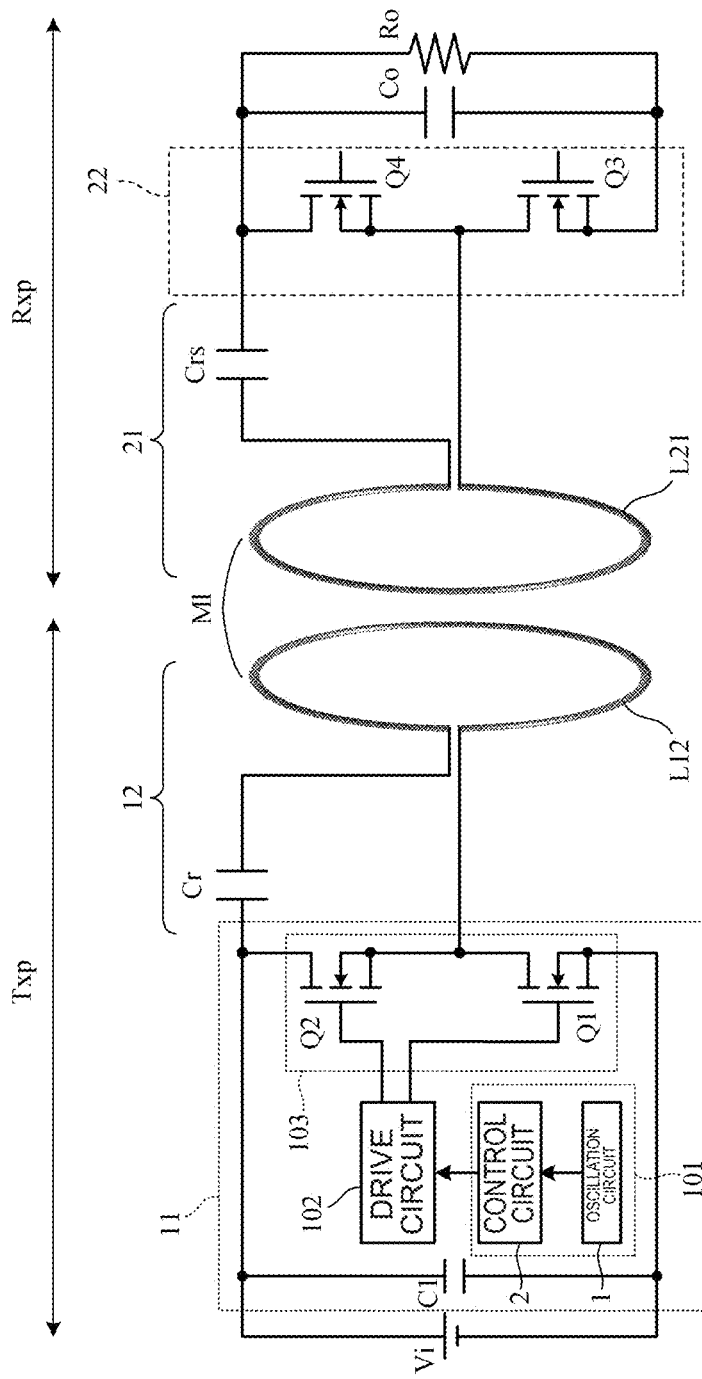
FIG. 30 is a diagram illustrating a configuration example of a wireless power transfer apparatus of the related art.

Although two relay devices are provided in the example illustrated in FIG. 27 and FIG. 28, three or more relay devices may be provided. FIG. 29 is a contour diagram illustrating the magnetic field intensity of a wireless power transfer system that includes one power transmission coil and 15 relay coils. In this case, among a total of 16 circular loop-shaped coils that are arranged in 4 rows and 4 columns, one of the coils (the left rear coil in FIG. 29) is a power transmission coil, and the remaining 15 coils are relay coils. The power reception coil L21 is disposed in a space enclosed by the relay coil (the right front coil in FIG. 29) that is located farthest from the power transmission coil.

According to the present embodiment, an electromagnetic resonance field is further expanded by a plurality of relay devices, and a spatial region in which wireless power transfer is desired to be realized can be further expanded.

Lastly, the descriptions of the above embodiments are examples in all respects, and the present disclosure is not limited to the embodiments. Modifications and changes can be suitably made by those skilled in the art. For example, the configurations according to the different embodiments may be partially replaced with one another or may be combined with each other. The scope of the present disclosure is to be determined not by the above-described embodiments, but by the claims. In addition, it is intended that meanings equal to the claims and all the modifications within the scope of the claims are included in the scope of the present disclosure.

What is claimed is:

1. A power transmission device included in a wireless power transfer system that includes the power transmission device and a power reception device and in which power is supplied from the power transmission device to the power reception device, the power reception device including a power reception coil, a power-reception resonance capacitor that forms a power-reception resonance mechanism with the power reception coil and a power reception circuit that is electrically connected to the power-reception resonance mechanism and that supplies power to a load, the power transmission device comprising:

a power transmission coil;

a power-transmission resonance capacitor that forms, together with the power transmission coil, a power-transmission resonance mechanism; and a power transmission circuit that is electrically connected to the power-transmission resonance mechanism and that is configured to intermittently apply a direct-current input voltage to the power-transmission resonance mechanism and cause the power transmission coil to generate an alternating-current voltage, the power transmission circuit including a control circuit section and a power circuit section, each of which is formed of an electronic circuit, the power circuit section being formed of an integrated circuit sealed in a package with a plurality of terminals, the integrated circuit being electrically and directly connected to the power-transmission resonance mechanism, the control circuit section being configured to output a driving signal to the power circuit section, and the power circuit section being configured to drive, by using the driving signal input to the power circuit section, a transistor provided in the integrated circuit, to intermittently apply the direct-current input voltage to the power-transmission resonance mechanism, wherein electric field energy and magnetic field energy of each of the power-transmission resonance mechanism and the power-reception resonance mechanism, interact with each other so as to form an electromagnetic resonance field, wherein electromagnetic field resonance coupling is formed of magnetic field coupling and electric field coupling between the power transmission coil and the power reception coil, and wherein the control circuit section and the power circuit section share the power-transmission resonance mechanism and a ground potential in common to reduce electromagnetic field noise caused by the electromagnetic resonance field.

2. The power transmission device according to claim 1, wherein:

at least a portion of the control circuit section and at least a portion of the power circuit section are formed of a complementary metal oxide semiconductor (CMOS) standard logic integrated circuit (IC) or a transistor-transistor logic (TTL) standard logic IC that includes a plurality of logic gate circuits and that is sealed in a single package with a plurality of terminals.

3. The power transmission device according to claim 2, wherein the CMOS standard logic IC or the TTL standard logic IC includes four two-input NAND gates.

4. A power transmission device included in a wireless power transfer system that includes the power transmission device and a power reception device and in which power is supplied from the power transmission device to the power reception device, the power reception device including a power reception coil, a power-reception resonance capacitor that forms a power-reception resonance mechanism with the power reception coil and a power reception circuit that is electrically connected to the power-reception resonance mechanism and that supplies power to a load, the power transmission device comprising:

a power transmission coil;

a power-transmission resonance capacitor that forms, together with the power transmission coil, a power-transmission resonance mechanism; and a power transmission circuit that is electrically connected to the power-transmission resonance mechanism and that is configured to intermittently apply a direct-current input voltage to the power-transmission resonance mechanism and cause the power transmission coil to generate an alternating-current voltage, the power transmission circuit including a control circuit section and a power circuit section, each of which is formed of an electronic circuit, the power circuit section being formed of an integrated circuit sealed in a package with a plurality of terminals, the integrated circuit being electrically and directly connected to the power-transmission resonance mechanism, the control circuit section being configured to output a driving signal to the power circuit section, and the power circuit section being configured to drive, by using the driving signal input to the power circuit section, a transistor provided in the integrated circuit, to intermittently apply the direct-current input voltage to the power-transmission resonance mechanism, wherein at least a portion of the control circuit section and at least a portion of the power circuit section are formed of a complementary metal oxide semiconductor (CMOS) standard logic integrated circuit (IC) or a transistor-transistor logic (TTL) standard logic IC that includes a plurality of logic gate circuits and that is sealed in a single package with a plurality of terminals, the CMOS standard logic IC or the TTL standard logic IC includes four two-input NAND gates, and the control circuit section includes an oscillation circuit that includes one of the four NAND gates and an oscillator, and the power circuit section includes the remaining NAND gates among the four NAND gates.

5. The power transmission device according to claim 4, wherein, in the control circuit section, one of the remaining NAND gates is connected to an output unit of the oscillation circuit.

6. The power transmission device according to claim 4, wherein some of the remaining NAND gates are connected in parallel.

7. The power transmission device according to claim 2, wherein the CMOS standard logic IC or the TTL standard logic IC includes six NOT gates.

8. The power transmission device according to claim 7, wherein the control circuit section includes an oscillation circuit that includes one of the six NOT gates and an oscillator, and the power circuit section includes the remaining NOT gates among the six NOT gates.

9. The power transmission device according to claim 8, wherein, in the control circuit section, one of the remaining NOT gates is connected to an output unit of the oscillation circuit.

10. The power transmission device according to claim 8, wherein some of the remaining NOT gates are connected in parallel.

11. The power transmission device according to claim 1, wherein the power circuit section is formed of a field effect transistor (FET) driving driver IC sealed in a package.

12. The power transmission device according to claim 2, wherein an output unit of the power circuit section is formed of two transistors that are bridge-connected between a power supply and a ground.

13. The power transmission device according to claim 4, wherein the oscillator is a device in which a piezoelectric vibrator is sealed in a package.

14. The power transmission device according to claim 4, wherein an oscillation frequency of the oscillation circuit is one of 6.78 MHz, 13.56 MHz, and 27.12 MHz, which are frequencies within the industrial, scientific, and medical (ISM) band.

15. The power transmission device according claim 1, wherein a filter circuit that enables a current at a switching frequency to flow through the filter circuit and suppresses a harmonic current is provided at a final stage of the power circuit section.

16. The power transmission device according to claim 1, wherein, in a switching operation performed by the power circuit section, a dead time in which transistors that operate complementarily to each other are both turned off is provided, and a lagging current, which lags a voltage, is generated.

17. The power transmission device according to claim 1, wherein the power circuit section and the control circuit section operate as a result of the same power supply voltage being applied to the power circuit section and the control circuit section.

* * * * *